US011247207B2

United States Patent
Jokerst et al.

(10) Patent No.: US 11,247,207 B2
(45) Date of Patent: Feb. 15, 2022

(54) MICROFLUIDIC SYSTEMS HAVING PHOTODETECTORS DISPOSED THEREIN AND METHODS OF PRODUCING THE SAME

(71) Applicant: Duke University, Durham, NC (US)

(72) Inventors: Nan Marie Jokerst, Durham, NC (US); Aditi Dighe, Durham, NC (US); Richard Fair, Durham, NC (US)

(73) Assignee: Duke University, Durham, NC (US)

( * ) Notice: Subject to any disclaimer, the term of this patent is extended or adjusted under 35 U.S.C. 154(b) by 191 days.

(21) Appl. No.: 16/654,657

(22) Filed: Oct. 16, 2019

(65) Prior Publication Data
US 2020/0114355 A1 Apr. 16, 2020

Related U.S. Application Data

(60) Provisional application No. 62/746,031, filed on Oct. 16, 2018.

(51) Int. Cl.
*B01L 3/00* (2006.01)
*H01L 31/0352* (2006.01)

(52) U.S. Cl.
CPC ... *B01L 3/502715* (2013.01); *B01L 3/502707* (2013.01); *H01L 31/035281* (2013.01); *B01L 2300/0663* (2013.01); *B01L 2300/12* (2013.01); *B01L 2300/168* (2013.01)

(58) Field of Classification Search
CPC ......... B01L 2300/0663; B01L 2300/12; B01L 2300/168; B01L 3/502707; B01L 3/502715; G01N 21/645; H01L 31/035281
See application file for complete search history.

(56) References Cited

U.S. PATENT DOCUMENTS

| | | | |
|---|---|---|---|
| 6,183,696 B1 | 2/2001 | Elkind et al. | |
| 6,602,791 B2 | 8/2003 | Ouellet et al. | |
| 8,846,414 B2 | 9/2014 | Sista et al. | |
| 2005/0024433 A1* | 2/2005 | Cruz-Uribe | B41J 2/14072 347/50 |
| 2011/0262307 A1* | 10/2011 | Packirisamy | G01N 21/05 422/82.08 |

(Continued)

FOREIGN PATENT DOCUMENTS

WO 2007144797 A1 12/2007

OTHER PUBLICATIONS

Adams, Mark L. et al. (2003) "Microfluidic Integration on Detector Arrays for Absorption and Fluorescence Micro-Spectrometers" Sensors and Actuators A Physical. vol. 104. Mar. 2003. DOI: 10.1016/S0924-4247(02)00477-6 (seven(7)pages).

(Continued)

*Primary Examiner* — Jennifer Wecker
(74) *Attorney, Agent, or Firm* — Olive Law Group, PLLC

(57) ABSTRACT

Microfluidic systems having photodetectors disclosed therein and methods of producing the same are disclosed herein. According to an aspect, a microfluidic system includes a body including an interior wall that at least partially defines an interior space for receipt of fluid. Further, the microfluidic system includes a photodetector disposed on the interior wall and positioned to receive light from fluid in the interior space for generating an electrical signal representative of the received light.

24 Claims, 16 Drawing Sheets

(56) References Cited

U.S. PATENT DOCUMENTS

| | | | | |
|---|---|---|---|---|
| 2012/0000777 A1* | 1/2012 | Garrell | ................... | C25B 7/00 |
| | | | | 204/451 |
| 2016/0049528 A1* | 2/2016 | Cho | ............... | H01L 31/035281 |
| | | | | 257/432 |

OTHER PUBLICATIONS

Augel. L, et al. (2017) "Optofluidic Sensor System with Ge PIN photodetector for CMOS-compatible Sensing" Microfluidics and Nanofluidics Journal. vol. 21. DOI 10.1007/s10404-017-2007-3 (five(5)pages).

Blue, Robert et al. (2016) "Recent Advances in Optical Fiber Devices for Microfluidics Integration" Journal of Biophotonics. vol. 9. DOI 10.1002/jbio.201500170 (thirteen(13)pages).

Chediak, J. Alex et al. (2004) "Heterogeneous Integration of CdS Filters with GaN LEDs for Fluorescence Detection Microsystems" Sensors and Actuators A: Physical Journal. vol. 111 doi:10.1016/j.sna.2003.10.015 (seven(7)pages).

Choi, Kyungyong et al. (2012) "Integration of Field Effect Transistor-Based Biosensors with a Digital Microfluidic Device for a lab-on-a-chip Application" Lab on a Chip Journal. vol. 12. DOI: 10.1039/c2lc21203j (seven(7)pages).

Fan, Fei et al. (2014) "Chemiluminescence Immunoassay Based on Microfluidic Chips for α-fetoprotein" Clinica Chimica Acta. International Journal of Clinical Chemistry and Diagnostic Laboratory Medicine. vol. 431. (five(5)pages).

Fan, Xudong et al. (2011) "Optofluidic Microsystems for Chemical and Biological Analysis" Nature Photonics vol. 5. Oct. 2011. DOI: 10.1038/nphoton.2011.206 (eight(8) pages).

Fard, Sahba Talebi et al. (2014) "Silicon-on-insulator Sensors Using Integrated Resonance-Enhanced Defect-Mediated Photodetectors" Optics Express Journal. vol. 22. Issue 23. DOI:10.1364/OE.22.028517 (thirteen(13) pages).

Franke, Thomas et al. (2009) "Surface acoustic wave (SAW) directed droplet flow in microfluidics for PDMS devices" Lab on a Chip Journal. vol. 9. DOI: 10.1039/b906819h (three(3)pages).

Hwang, Hyerim et al. (2011) "Microfluidic Fabrication of SERS-active Microspheres for Molecular Detection" Lab on a Chip Journal. vol. 11. Issue 87. DOI: 10.1039/c0lc00125b (six(6)pages).

Kuswandi, Bambang et al. (2007) "Optical Sensing Systems for Microfluidic Devices: A review" Analytica Chimica Acta Journal. vol. 601. doi:10.1016/j.aca.2007.08.046 (fifteen(15)pages).

Lederer, Thomas et al. (2011) "Utilizing a High Fundamental Frequency Quartz Crystal Resonator as a Biosensor in a Digital Microfluidic Platform" Sensors and Actuators A: Physical Journal. vol. 172. doi:10.1016/j.sna.2011.04.032 (eight(8)pages).

LeMinh, P. et al. "Monolithic Integration of a Novel Microfluidic Device with Silicon Light Emitting Diode-Antifuse and Photodetector" (four(4)pages).

Luan, Lin et al. (2008) "Integrated Optical Sensor in a Digital Microfluidic Platform" The IEEE Sensors Journal. vol. 8, No. 5, DOI: 10.1109/JSEN.2008.918717. May 2008. (eight(8)pages).

Luan, Lin et al. (2012) "Chip Scale Optical Microresonator Sensors Integrated With Embedded Thin Film Photodetectors on Electrowetting Digital Microfluidics Platforms" IEEE Sensors Journal. vol. 12. Issue 6. Jun. 2012. DOI: 10.1109/JSEN.2011.2179027 (seven(7)pages).

Luka, G. et al. 2015 "Microfluidics Integrated Biosensors: A Leading Technology towards Lab-on-a-Chip and Sensing Applications" Sensors 15(12), 30011-30031. https://doi.org/10.3390/s151229783 (twenty-one (21) pages).

Luo, Yiqi et al. (2008) "Microfluidic Device for Immunoassays Based on Surface Plasmon Resonance Imaging" Lab on a Chip Journal. vol. 8. DOI: 10.1039/b800606g (seven (7) pages).

Namasivayam, Vijay et al. (2004) "Advances in on-chip Photodetection for Applications in Miniaturized Genetic Analysis Systems" Journal of Micromechanics and Microengineering. vol. 14. DOI: 10.1088/0960-1317/14/1/311 (ten 10)pages).

Pais, Andrea et al. (2008) "High-sensitivity, Disposable Lab-on-a-chip With Thin-Film Organic Electronics for Fluorescence Detection" Lab on a Chip Journal. vol. 8. DOI: 10.1039/b715143h (seven(7)pages).

Pang, Shuo et al. (2010) "Implementation of a Color-Capable Optofluidic Microscope on a RGB CMOS Color Sensor Chip Substrate" Lab on a Chip Journal. DOI: 10.1039/b919004j (four(4)pages).

Sepulveda, B. et al. (2006) "Optical Biosensor Microsystems Based on the Integration of Highly Sensitive Mach-Zehnder Interferometer Devices" Journal of Optics A: Pure and Applied Optics. vol. 8. doi:10.1088/1464-4258/8/7/S41 (six(6)pages).

Thrush, Evan et al. (2005) "Monolithically Integrated Semiconductor Fluorescence Sensor for Microfluidic Applications" Sensors and Actuators B Chemical Journal. vol. 105. doi:10.1016/j.snb.2004.06.028 (seven(7)pages).

Webster, J.R et al. (2001) "Monolithic Capillary Electrophoresis Device with Integrated Fluorescence Detector" Analytical Chemistry Journal. vol. 73. Issue 7. (five(5)pages).

Williams, Graeme et al. (2014) "Integration of Organic Light Emitting Diodes and Organic Photodetectors for Lab-on-a-Chip Bio-Detection Systems" Electronics Journal. vol. 3 doi:10.3390/electronics3010043 (thirty-three(33)pages).

Wu, Jing et al. (2011) "Microfluidic Sensing: State of the Art Fabrication and Detection Techniques" Journal of Biomedical Optics. vol. 16(8) Aug. 2011. (thirteen(13) pages).

Yu, Yuhua et al. (2014) "Parallel-plate lab-on-a-chip Based on Digital Microfluidics for on-chip Electrochemical Analysis" Journal of Micromechanics and Microengineering doi:10.1088/0960-1317/24/1/015020 (eight(8)pages).

Zhou, Qing et al. (2014) "On-chip Regeneration of Aptasensors for Monitoring Cell Secretion" Lab on a Chip Journal. vol. 14 DOI: 10.1039/c3lc50953b (four(4) pages).

* cited by examiner

MICROFLUIDIC SYSTEMS HAVING PHOTODETECTORS DISPOSED THEREIN AND METHODS OF PRODUCING THE SAME

CROSS REFERENCE TO RELATED APPLICATION

This application claims priority to U.S. Provisional Patent Application No. 62/746,031, filed Oct. 16, 2018, and titled SYSTEMS AND DEVICES COMPRISING INTEGRATED THIN FILM SILICON DETECTORS AND METHODS OF USING SAME, the content of which is incorporated herein by reference in its entirety.

FEDERALLY SPONSORED RESEARCH OR DEVELOPMENT

This invention was made with government support under grant number CNS-1135853 awarded by National Science Foundation. The government has certain rights to this invention.

TECHNICAL FIELD

The presently disclosed subject matter relates generally to microfluidics and optics. Particularly, the presently disclosed subject matter relates to microfluidic systems having photodetectors disclosed therein.

BACKGROUND

Microfluidics is a field which deals with the study of the behavior, precise control, and manipulation of fluids that a geometrically constrained to a small, sub-millimeter scale. Microfluidic devices are increasingly finding application and acceptance in many fields of biology, chemistry, medicine, environmental monitoring, drug discovery, and consumer electronics. Miniaturization of traditional devices, particularly analytical devices, is expected to lead to many benefits including reduced consumption and cost of reagents and samples, higher throughput and automation, faster analysis times, and more reliable, inexpensive, and portable instrumentation. As more functionality becomes embedded within these devices, fully integrated micro-total-analysis systems (μ TAS) or labs-on-a-chip (LOC) are becoming a reality and increasingly important. LOC is an emerging paradigm which aims to miniaturize and integrate fluid-handling onto a chip. An LOC can enable fluid dispensing, transport, mixing, incubation, detection/separation, and waste disposal. Microfluidic LOC systems can be broadly categorized into continuous-flow and discrete-flow systems. A continuous-flow system is self-descriptive, and in discrete-flow systems the fluid is discretized into droplets. A common limitation of continuous flow systems is that fluid transport is physically confined to fixed channels, whereas droplet-based (or discrete-flow) systems can be either confined to physical channels or operate on planar and channel-less systems. The transport mechanisms generally used in continuous-flow systems are pressure-driven by external pumps or electrokinetically-driven by high-voltages.

Discrete-flow or droplet-based microfluidic systems have been progressing steadily to fulfill the promise of the LOC concept to handle all steps of analysis, including sampling, sample preparation, sample-processing including transport, mixing, and incubation, detection, and waste handling. These steps have been designed to be performed on-chip without significant off-chip support systems. A few discrete-flow approaches have been recently developed for manipulating droplets based on multilayer soft lithography, hydrodynamic multiphase flows, continuous electrowetting, electrowetting-on-dielectric (EWOD), dielectrophoresis, electrostatics, and surface acoustic waves. Some of the above techniques manipulate droplets or slugs in physically confined channels while other techniques allow manipulation of droplets on planar surfaces without any physically defined channels. The channel-less droplet-based approaches have been referred to as "digital microfluidics" because the liquid is discretized and programmably manipulated.

Droplet-based protocols are very similar to bench-scale biochemical protocols which are also generally executed on discrete volumes of fluids. Therefore, established protocols can be easily adapted to digital microfluidic format. Some of the distinguishing features of digital microfluidic systems include: reconfigurability (droplet operations and pathways are selected through a software control panel to enable users to create any combination of microfluidic operations on-the-fly); software programmability also results in design flexibility where one generic microfluidic processor chip can be designed and reprogrammed for different applications; conditional execution steps can be implemented as each microfluidic operation can be performed under direct computer control to permit maximum operational flexibility; multidirectional droplet transport since the channels only exist in the virtual sense and can be instantly reconfigured through software; small droplet volumes completely electronic operation without using external pumps or valves; simultaneous and independent control of many droplets; and channel-less operation (where no priming is required).

Integrating low-cost, optical sensing directly into microfluidic systems can enable the next generation of portable, individualized diagnostic systems. Fluorescence sensing is an example type of sensing in microfluidic systems. Fluorescence sensing is particularly widespread in applications such as biochemical sensing for medical applications and for DNA/RNA diagnostics. Intensity-based fluorescence sensing provides fast (~microseconds or less), localized detection that can be correlated to the concentration of the target analyte. The real-time speed of the sensing and the possibility of multi-target sensing using multiple fluorophores with non-overlapping spectra makes the integration of fluorescence with microfluidic systems particularly interesting. There are multiple ways of detecting fluorescence, such as time-resolved anisotropy, fluorescence resonance energy transfer and fluorescence cross-correlation spectroscopy.

Current microfluidic LOC systems that use fluorescent sensing utilize external optical sensing. It is desired to provide for smaller, better performing, and more conveniently operable optical sensors for microfluidic LOC systems.

BRIEF DESCRIPTION OF THE DRAWINGS

Figure 1:
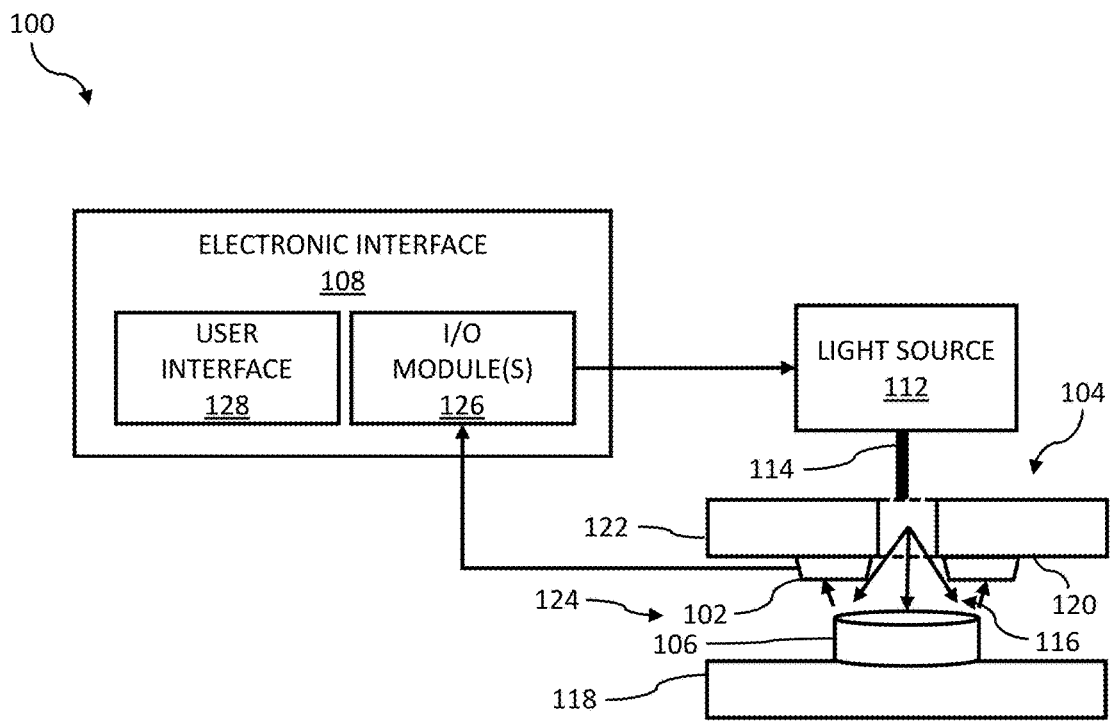
Figure 2:
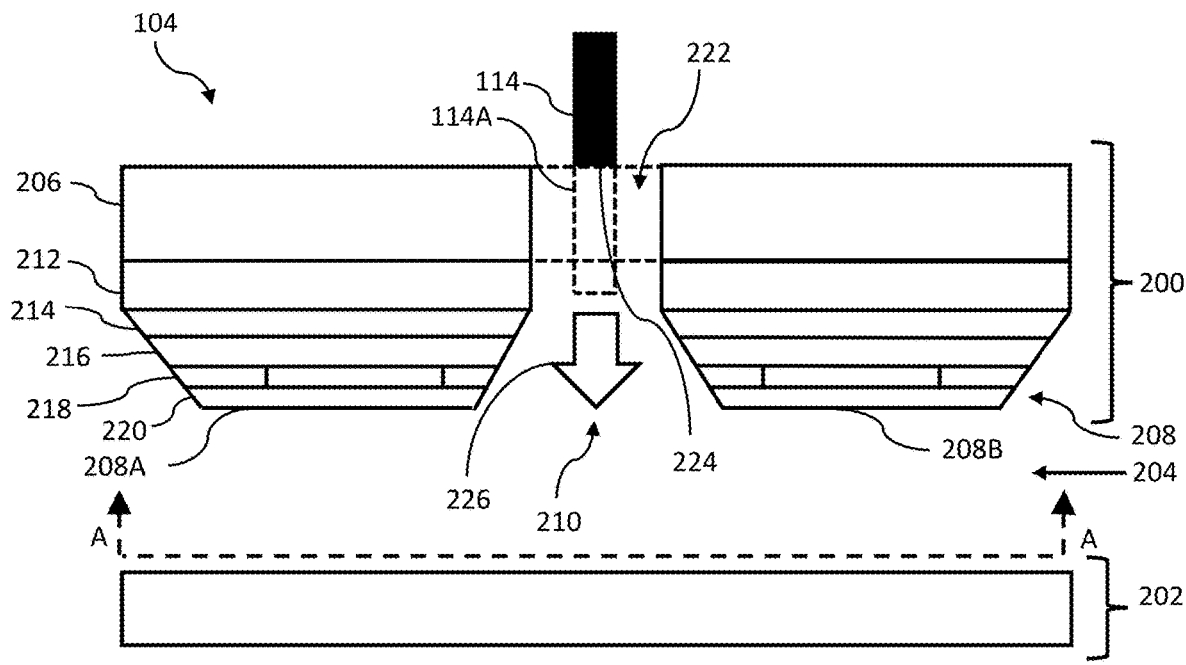
Figure 3:
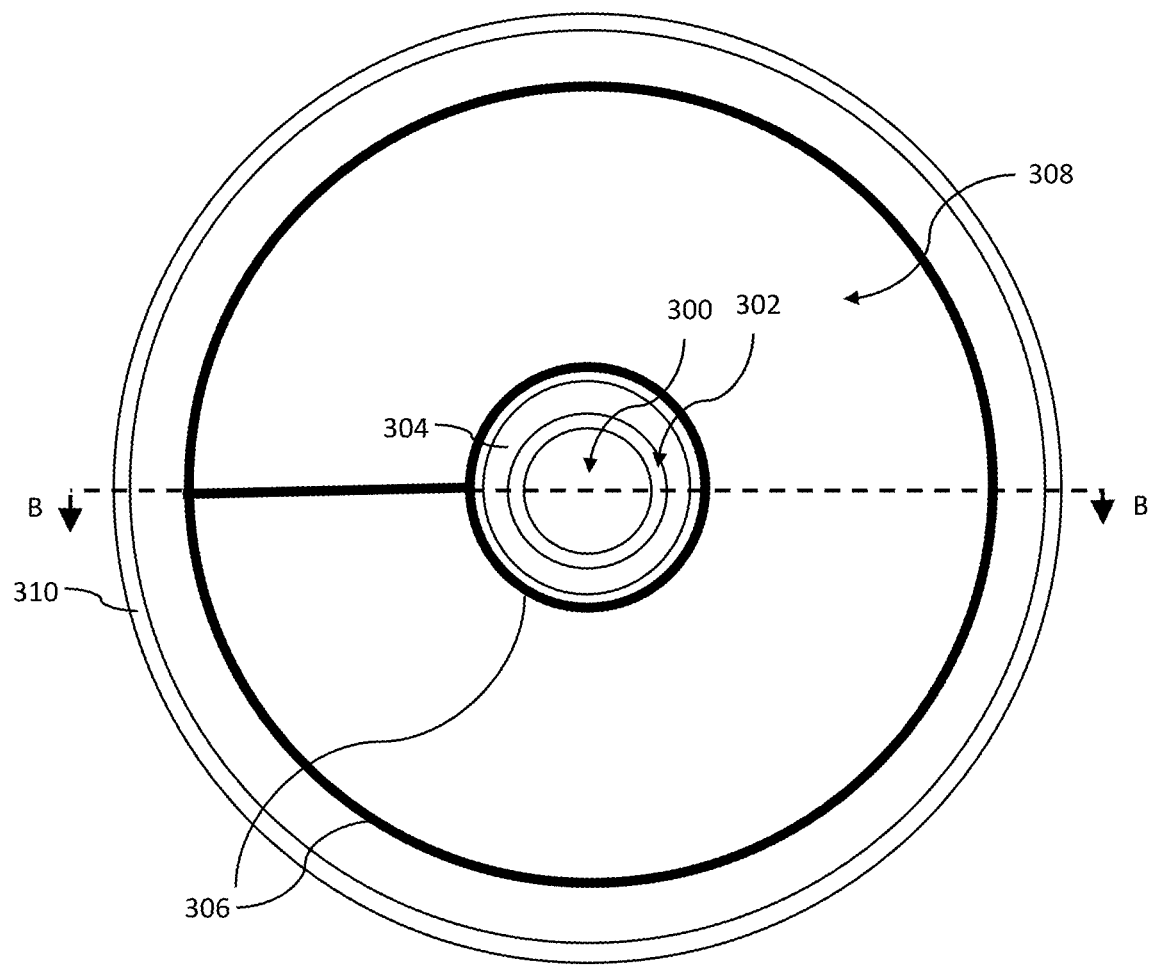
Figure 4:
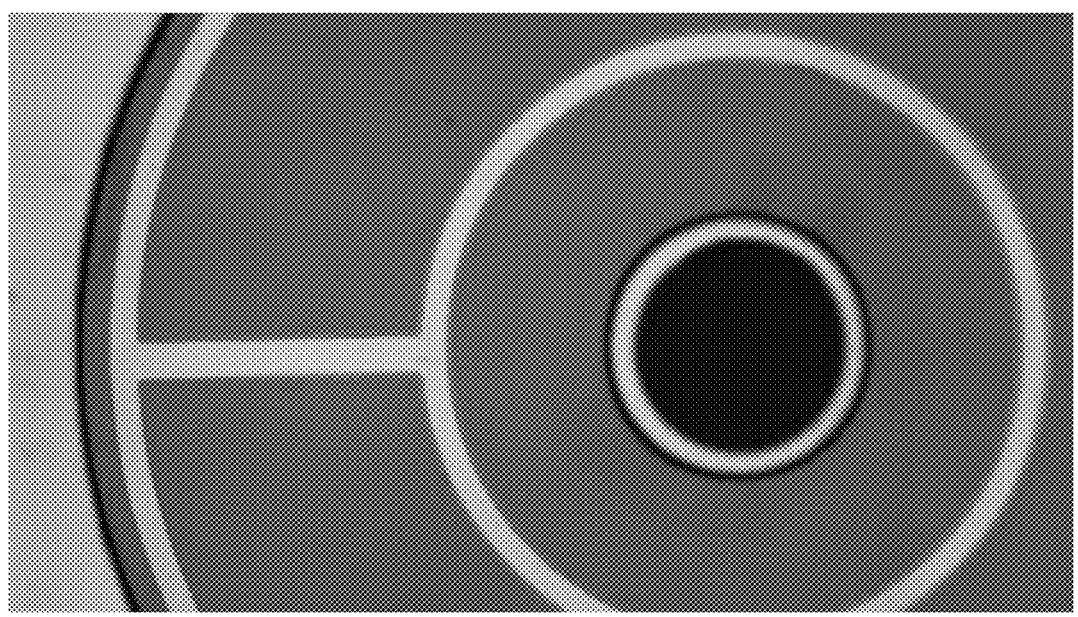
Figure 5:
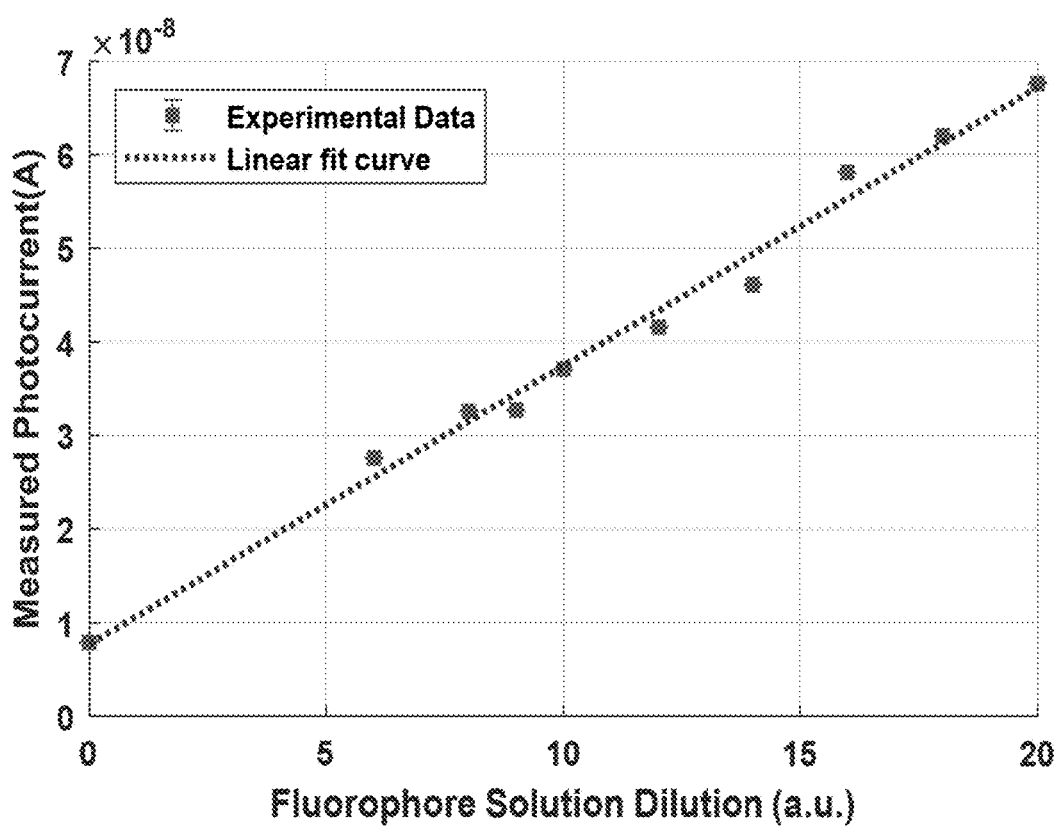

Having thus described the presently disclosed subject matter in general terms, reference will now be made to the accompanying Drawings, which are not necessarily drawn to scale, and wherein:

FIG. 1 is a block diagram of a microfluidic system including a photodetector integrated within a microfluidic device (shown in cross-sectional side view) for acquisition of data of a fluid under test in accordance with embodiments of the present disclosure;

FIG. 2 is a cross-sectional side view of an example microfluidic device including a photodetector integrated therein for acquisition of data of a fluid under test in accordance with embodiments of the present disclosure;

FIG. 3 is a top view of the photodetector or photodetectors in accordance with embodiments of the present disclosure;

FIG. 4 is a photomicrograph of an annular, thin film silicon photodetector bonded to a borosilicate substrate in accordance with embodiments of the present disclosure;

FIG. 5 is a graph showing mean measured photocurrent by a microfabricated photodetector as a function of the change in fluorophore solution dilution; higher the number, higher is the concentration of the solution.

Figure 6:
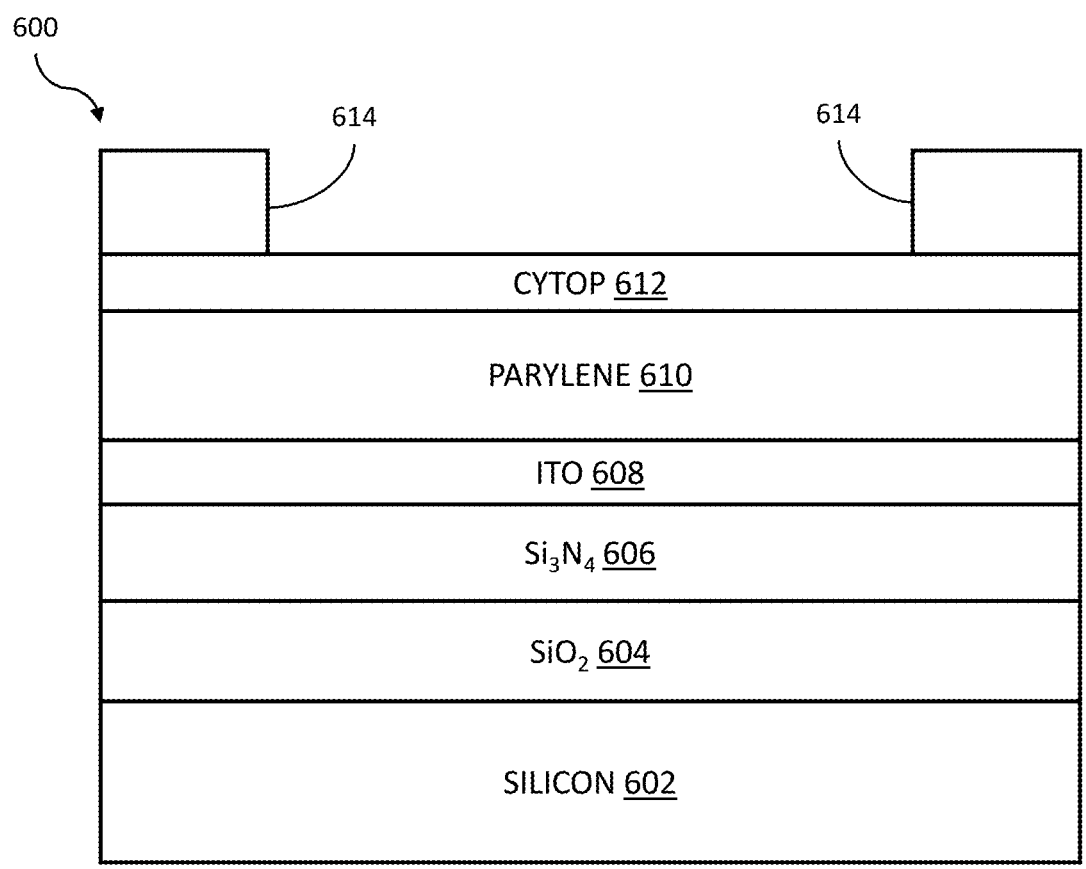
Figure 7A:
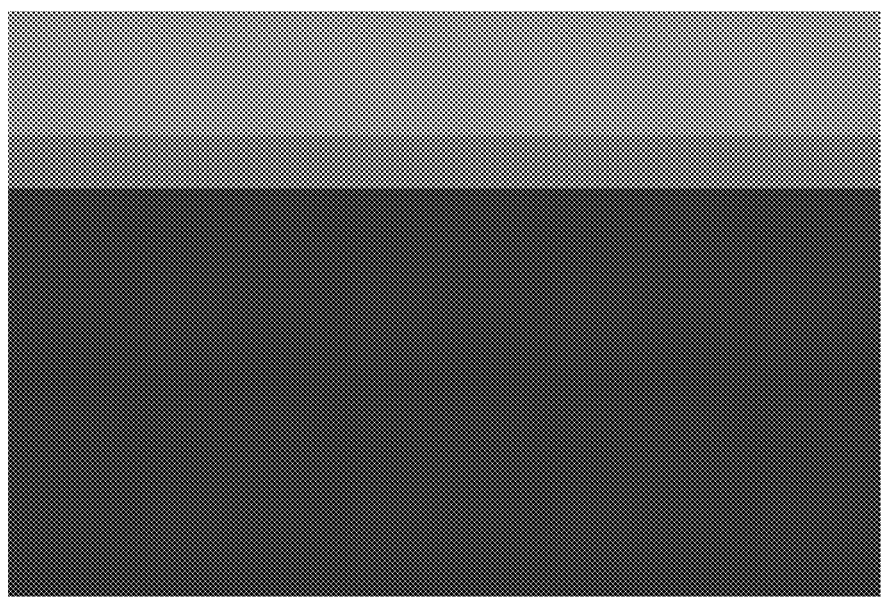
Figure 7B:
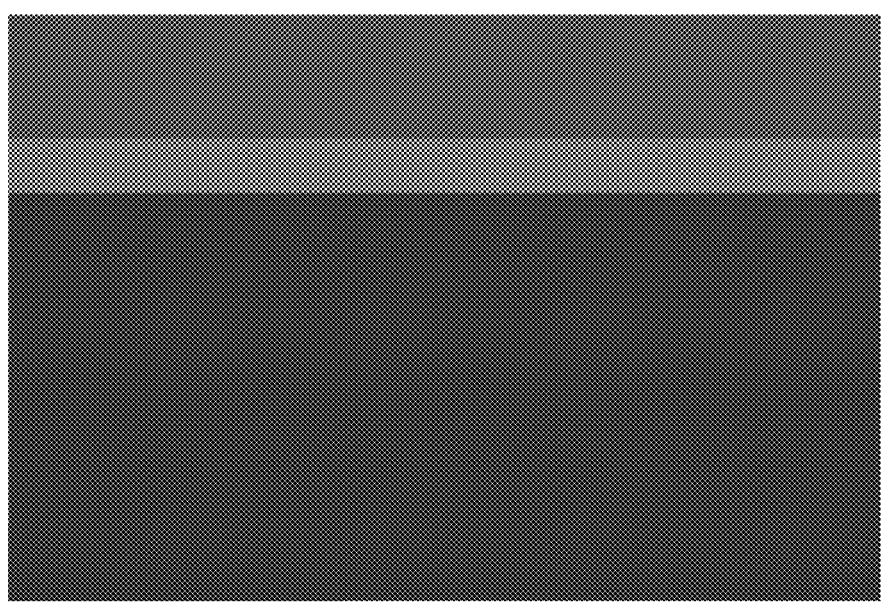
Figure 7C:
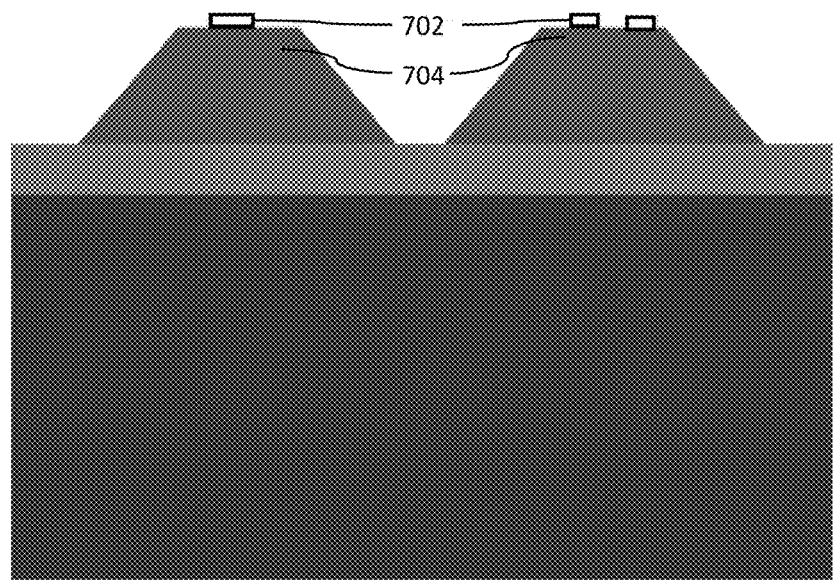
Figure 7D:
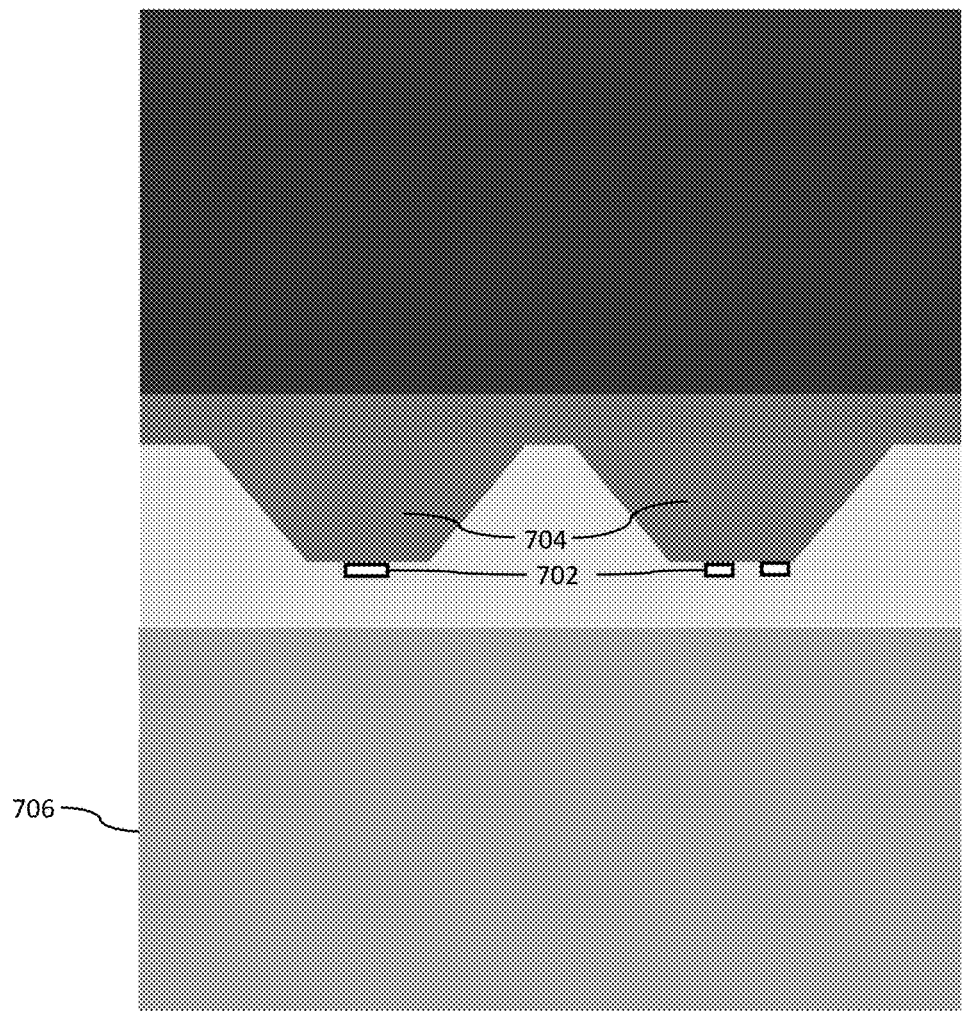
Figure 7E:
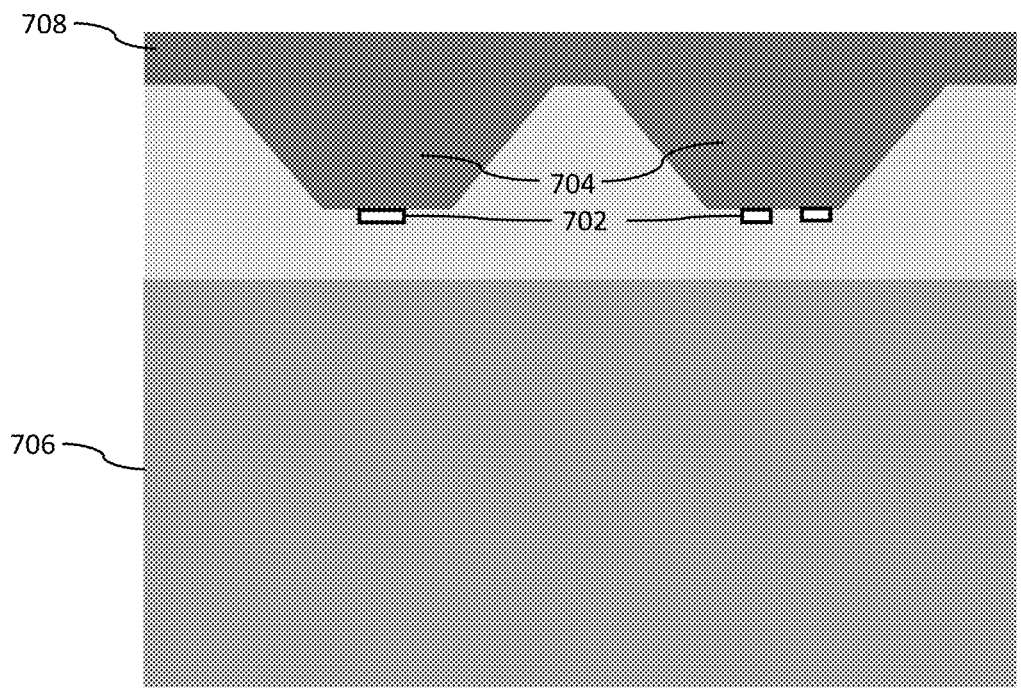
Figure 7F:
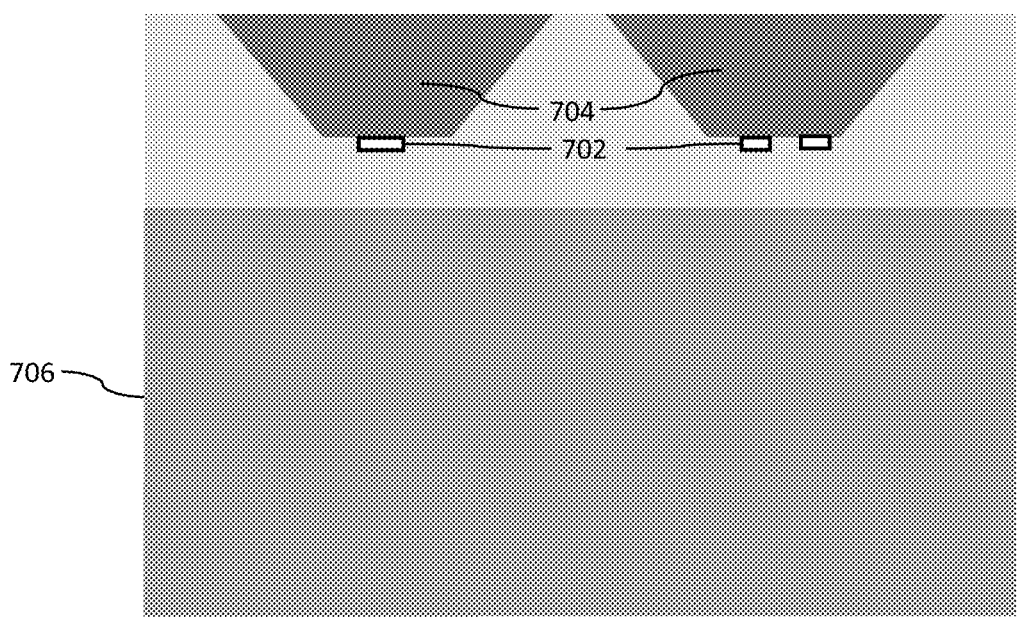
Figure 7G:
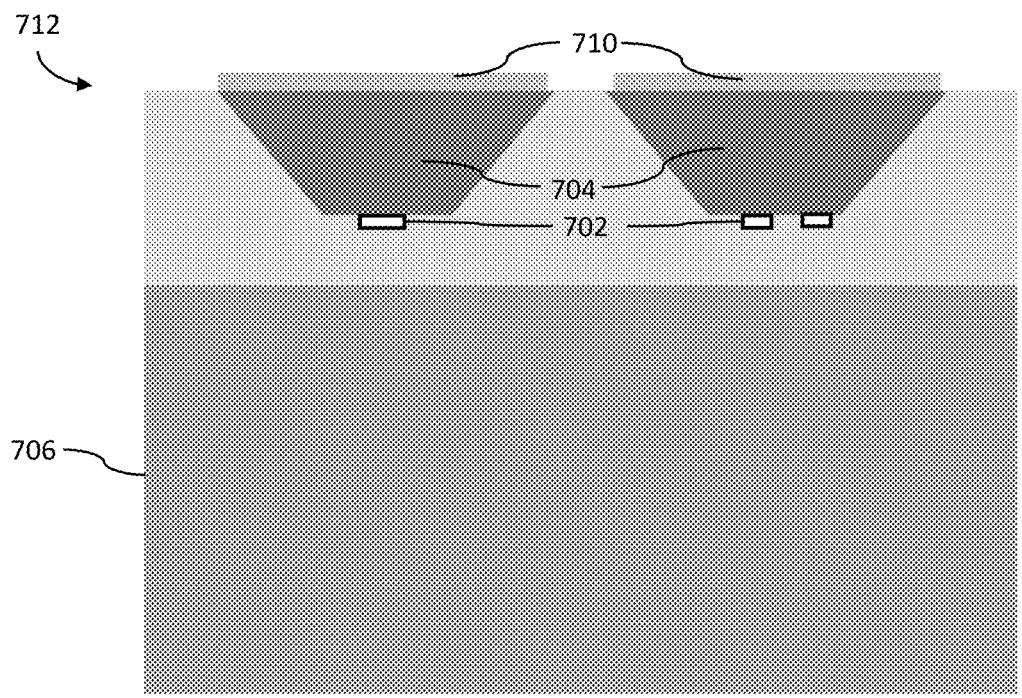
Figure 7H:
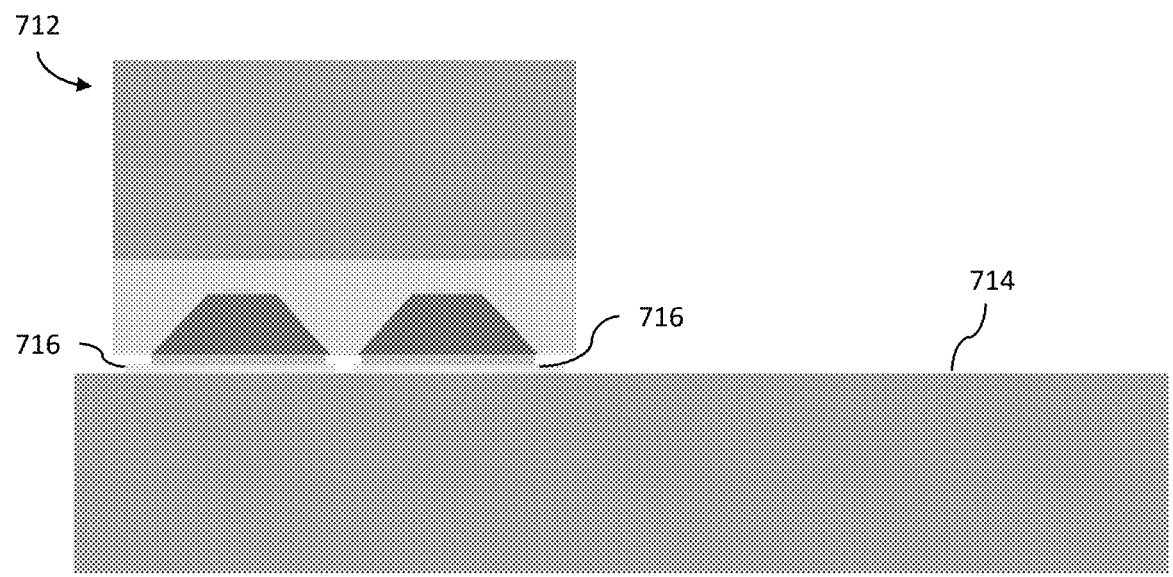
Figure 7I:
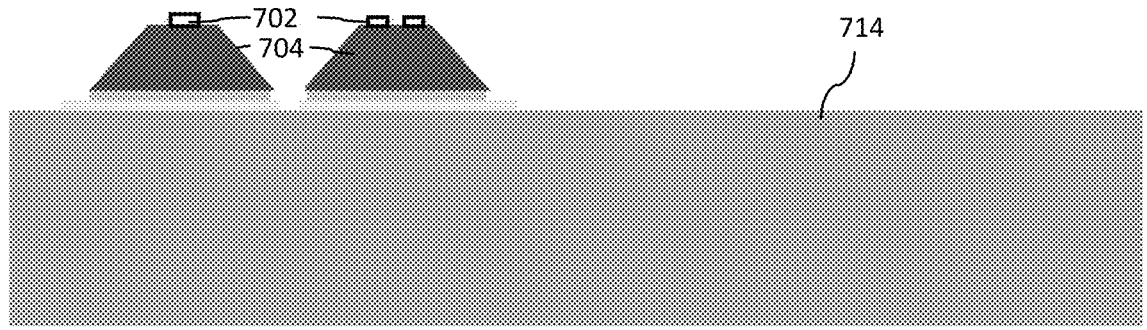
Figure 7J:
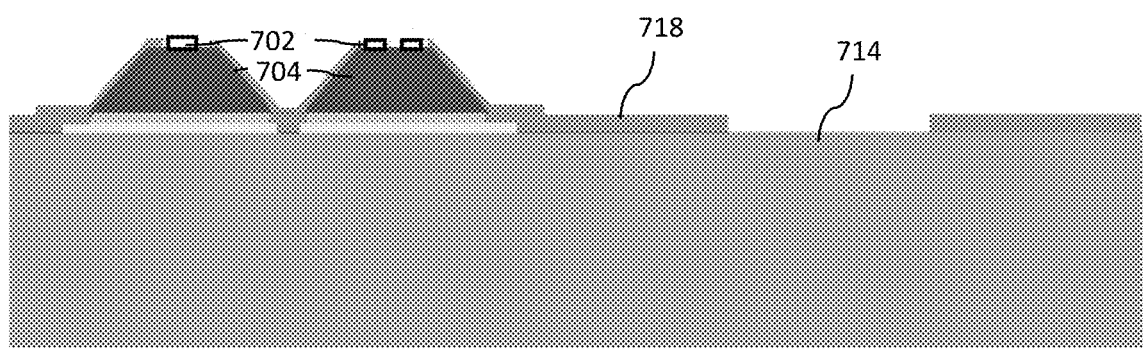
Figure 7K:
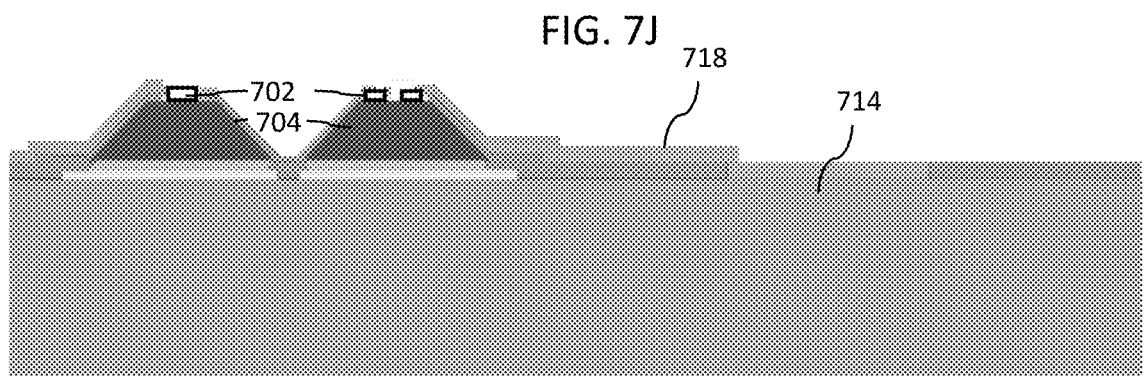
Figure 8A:
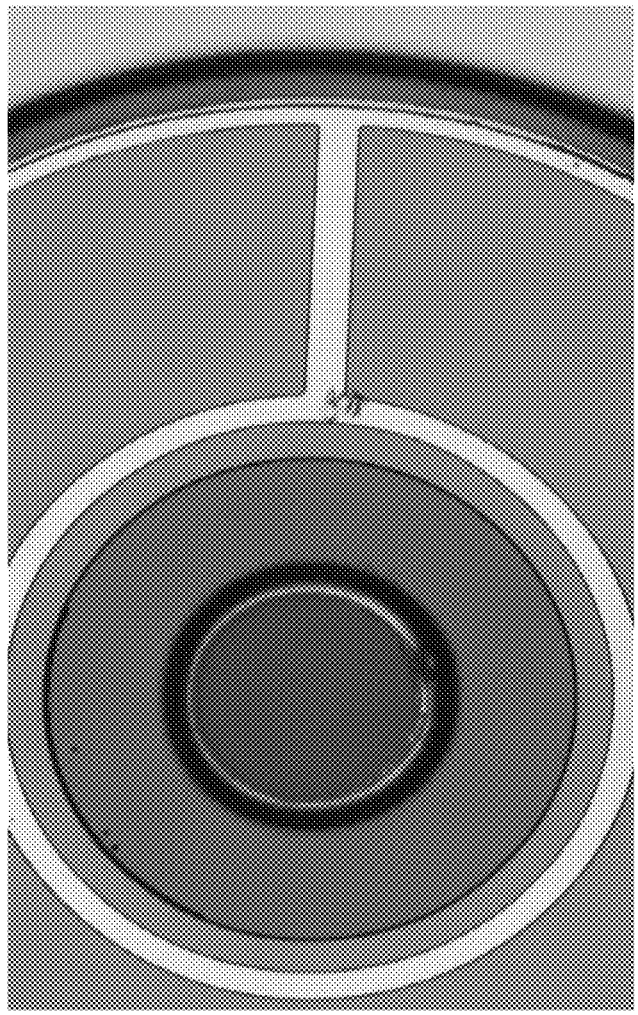
Figure 8B:
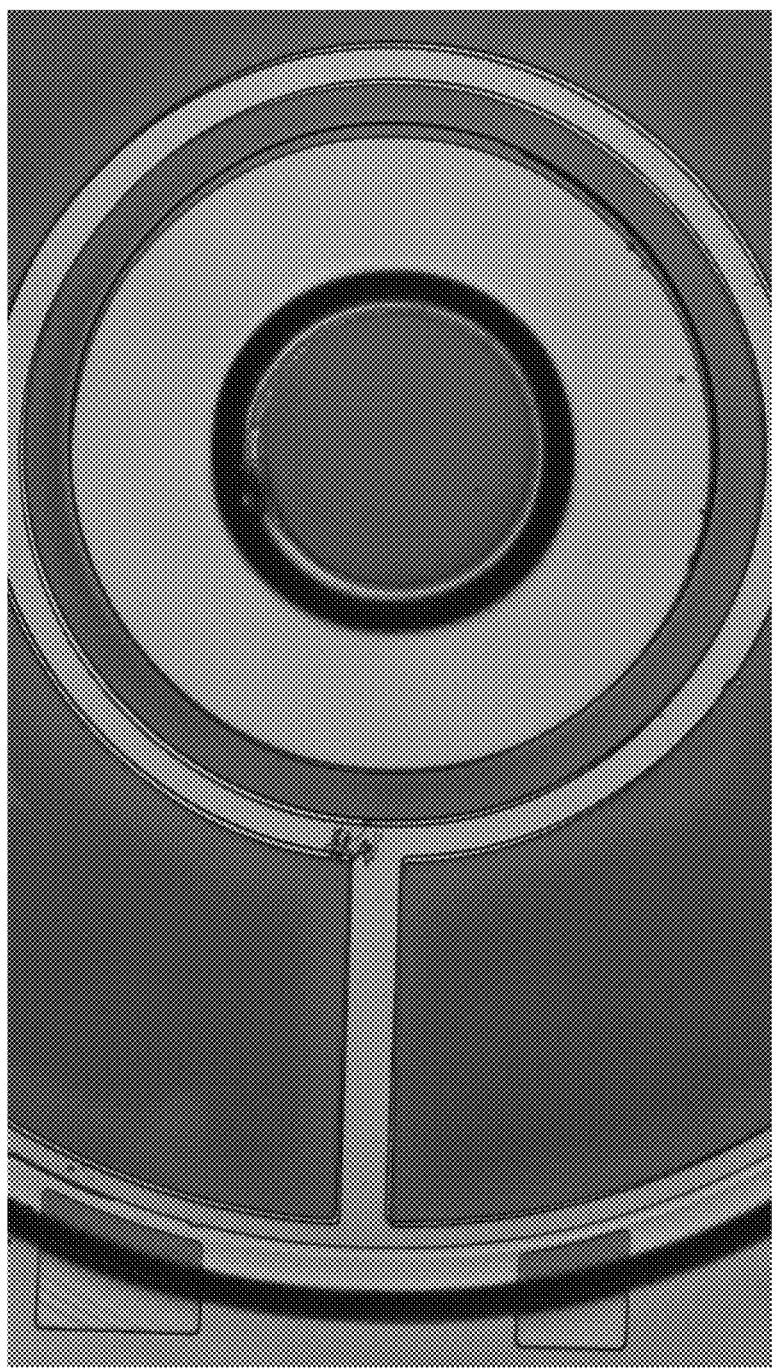
Figure 9:
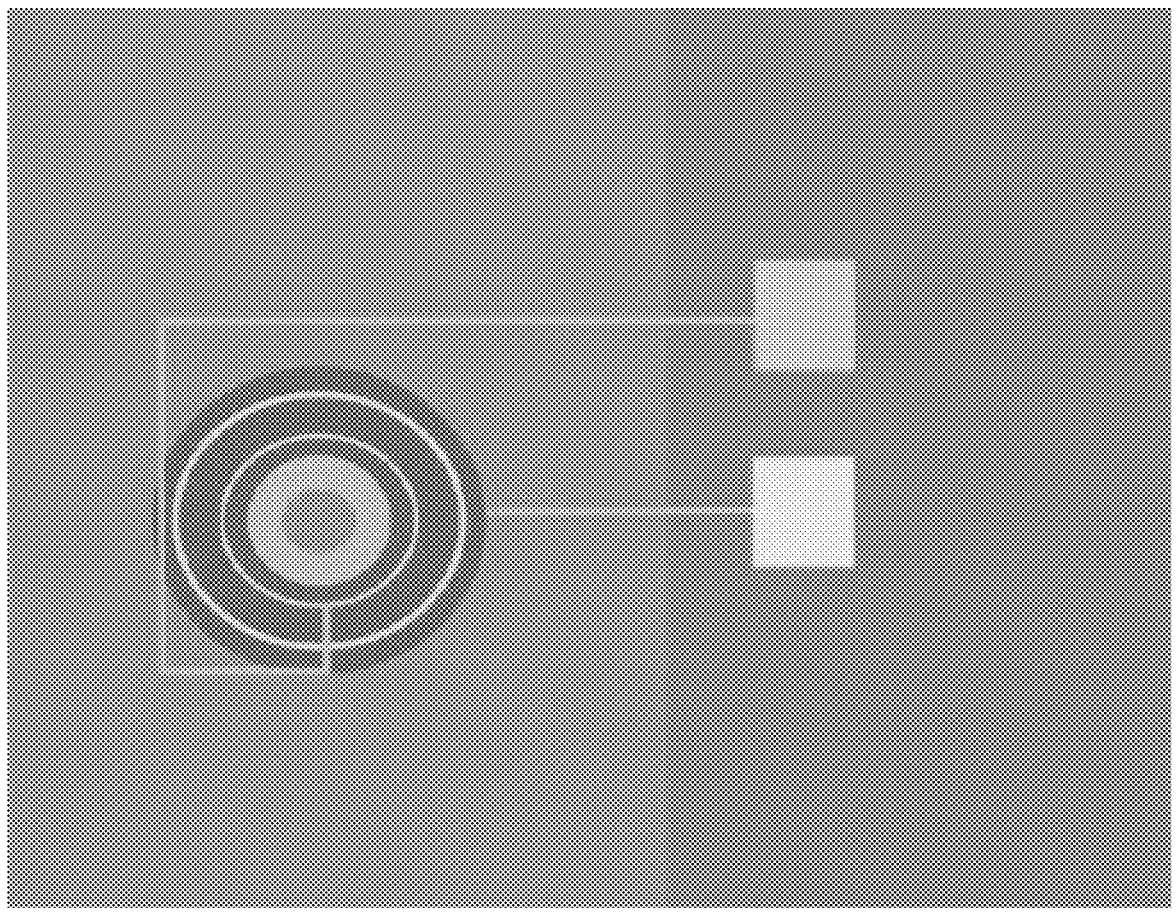
Figure 10:
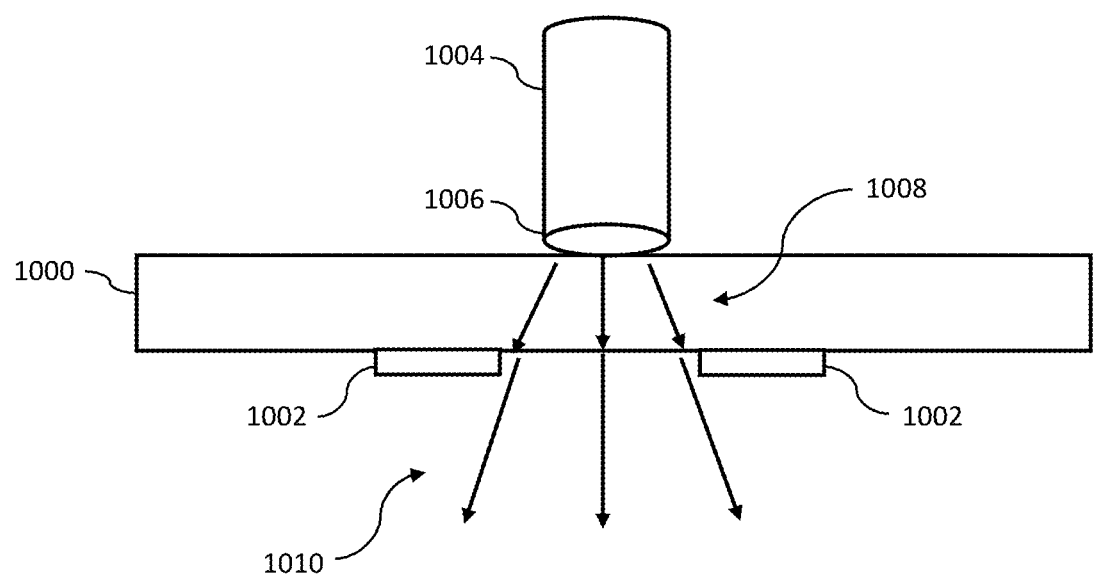
Figure 11:
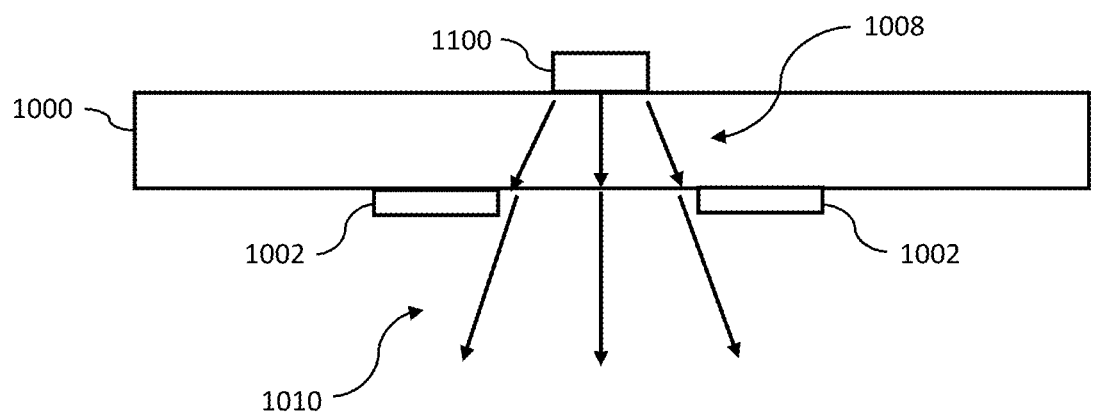
Figure 12:
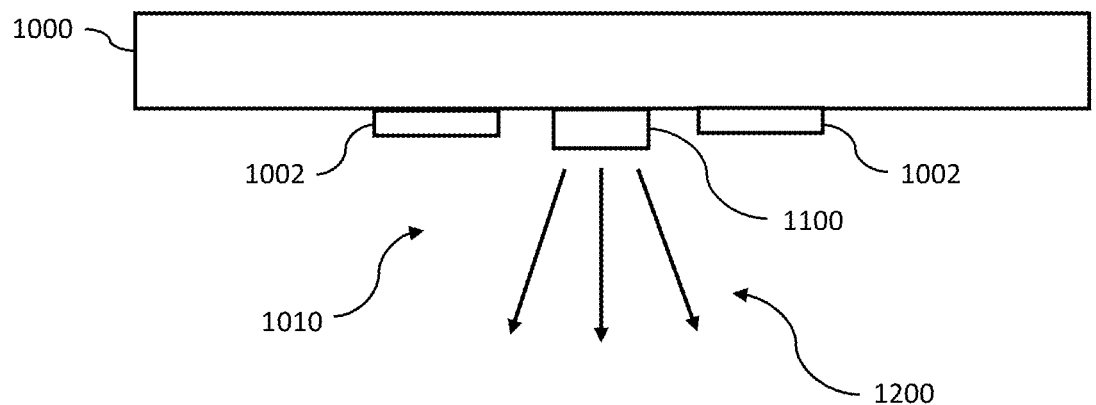
Figure 13:
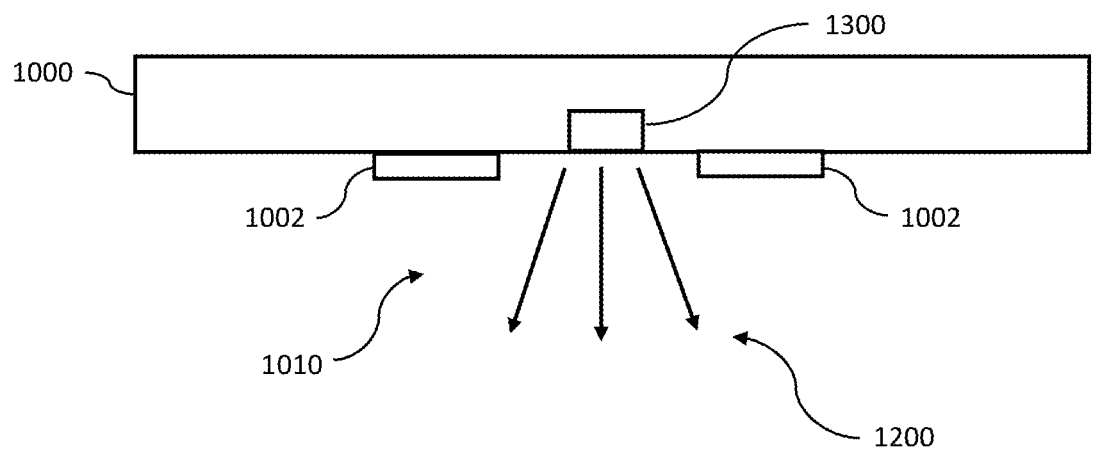
Figure 14:
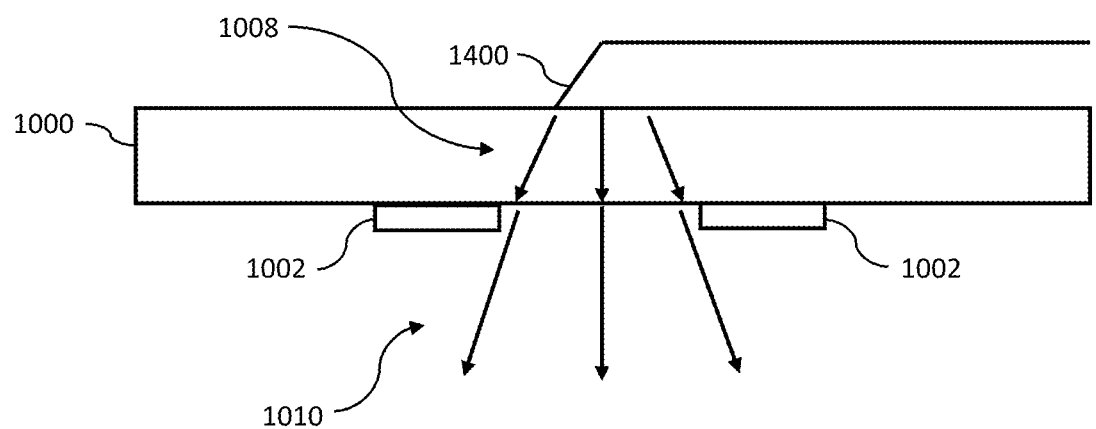
Figure 15:
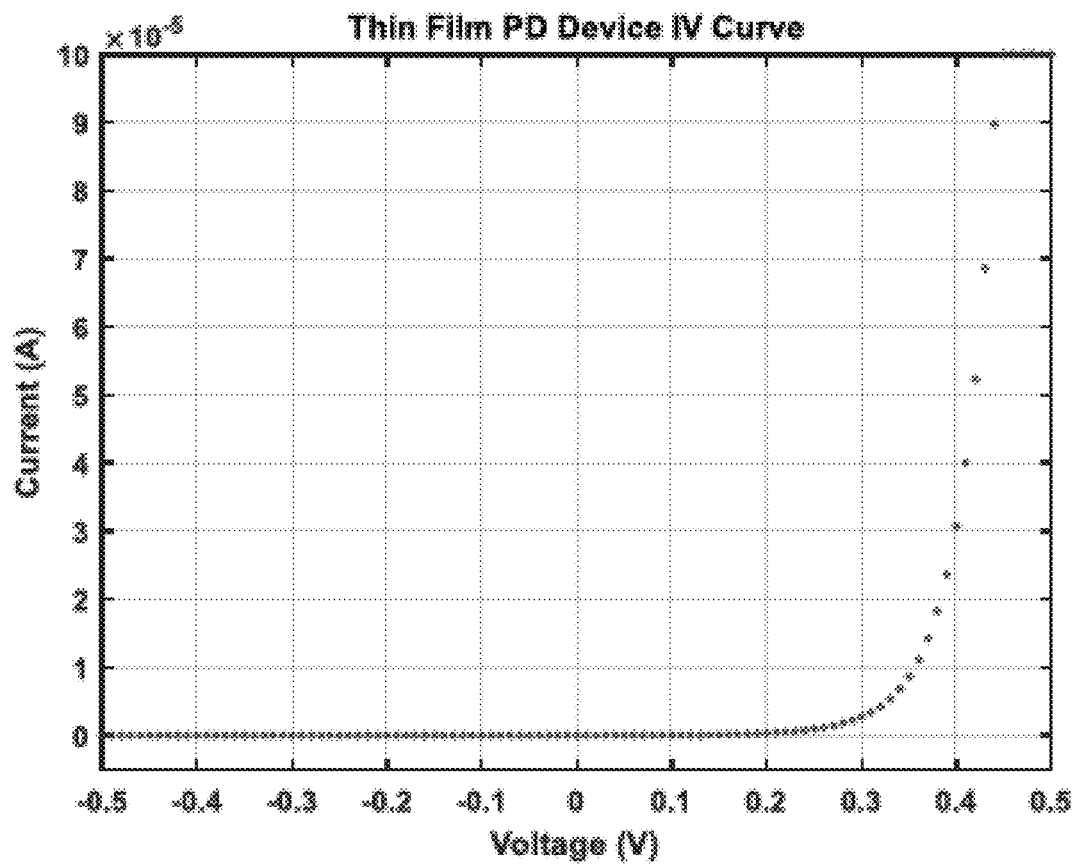
Figure 16:
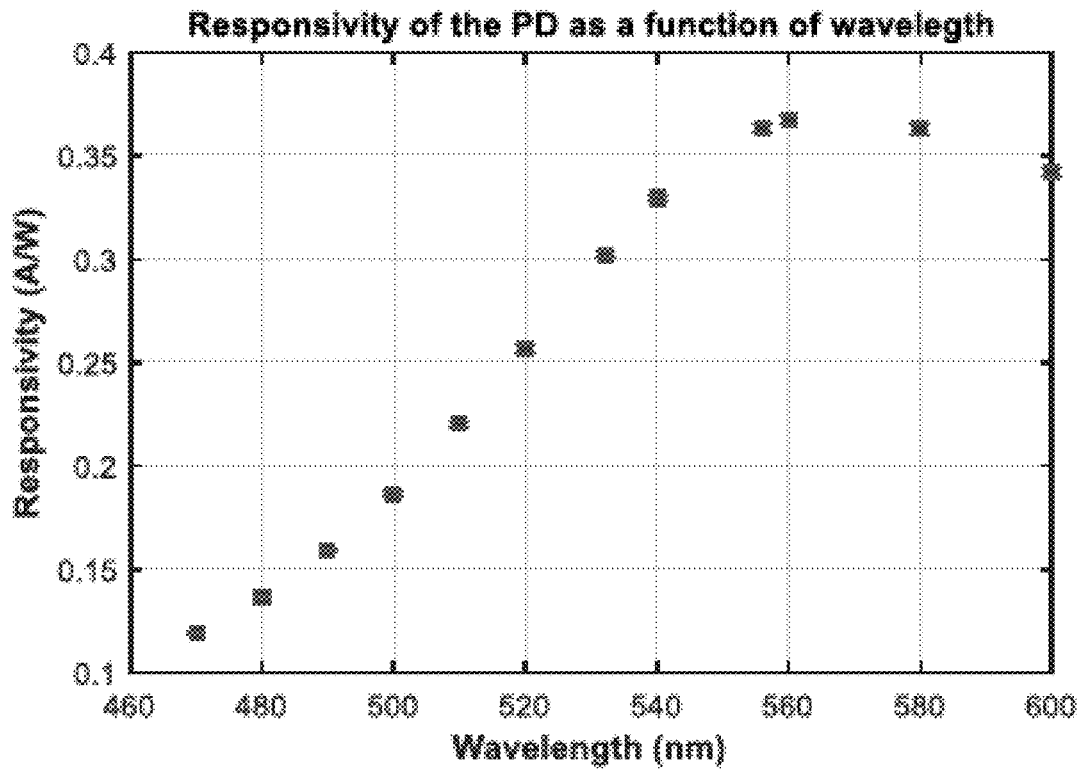

FIG. 6 is a cross-sectional view of one example of a bottom plate for use with a microfluidic system as disclosed herein;

FIGS. 7A-7K are cross-sectional side views showing one example of various stages in an example microfabrication process for producing a microfluidic device in accordance with embodiments of the present disclosure;

FIG. 8A is an image of a top view of the device after the step of FIG. 7J and before the step of FIG. 7K;

FIG. 8B is an image of a top view of the device as of a final step of an example fabrication;

FIG. 9 is a top view of a schematic of the device after patterning and evaporating Ti/Au lead to the contact on the device, and depositing SiN anti-reflection coating;

FIG. 10 is a cross-sectional side view of an example top plate, photodetector, and light source configuration for a microfluidic device in accordance with embodiments of the present disclosure;

FIG. 11 is a cross-sectional side view of portion of a microfluidic device in which an optical source (such as a laser, LED, etc.) is disposed on its outside surface in accordance with embodiments of the present disclosure;

FIG. 12 is a cross-sectional side view of a portion of a microfluidic device in which an LED or thin film emitter is disposed in its interior space in accordance with embodiments of the present disclosure;

FIG. 13 is a cross-sectional side view of a portion of a microfluidic device in which a waveguide is integrated into a top plate of a microfluidic device in accordance with embodiments of the present disclosure;

FIG. 14 is a cross-sectional side view of portion of a microfluidic device in which a waveguide is disposed on its outside surface in accordance with embodiments of the present disclosure;

FIG. 15 is a graph showing characterization of a photodetector fabricated for experimentation; and FIG. 16 is a graph showing another characterization of a photodetector fabricated for experimentation.

SUMMARY

The presently disclosed subject matter discloses microfluidic systems having photodetectors disclosed therein and methods of producing the same. According to an aspect, a microfluidic system includes a body including an interior wall that at least partially defines an interior space for receipt of fluid. Further, the microfluidic system includes a photodetector disposed on the interior wall and positioned to receive light from fluid in the interior space for generating an electrical signal representative of the received light.

According to another aspect, a method of producing a microfluidic system includes fabricating a photodetector on a side of substrate. Further, the method includes using the substrate to form a body with an interior space for receipt of fluid. The photodetector is positioned within the interior space to receive light from fluid in the interior space for generating an electrical signal representative of the received light.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Moreover, the present disclosure also contemplates that in some embodiments, any feature or combination of features set forth herein can be excluded or omitted. To illustrate, if the specification states that a complex comprises A, B, and C, it is specifically intended that any of A, B or C, or a combination thereof, can be omitted and disclaimed singularly or in any combination.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

FIG. 1 illustrates a block diagram of a microfluidic system 100 including one or more photodetectors 102 (which has an aperture or hole in the center) integrated within a microfluidic device 104 (shown in cross-sectional side view) for acquisition of data of a fluid 106 under test in accordance with embodiments of the present disclosure. Referring to FIG. 1, the system 100 includes an electronic interface 108 for controlling a light source 112 to generate light to illuminate fluid 106 and for reading the output from the photodetector. It is noted that the microfluidic system 100 shown in FIG. 1 may be implemented in any suitable system such as a continuous flow system, droplet-based system, digital microfluidic system, and the like.

The light source 112 may be operatively connected to an end of an optical fiber 114 such that light generated by the light source 112 enters at that end, passes through the optical fiber 114, and exits at the opposing end of the optical fiber 114. Light exiting the optical fiber 114 is generally indicated by arrows 116. The light 116 is incident on fluid 106, which may include a fluorophore that is excited by the light 116. The microfluidic device 104 may include a bottom plate 118 that may absorb light directed thereto.

A second option for the light source is to integrate one or more emitters (for example, LEDs or lasers) onto the outer surface of the top microfluidic plate. This emitter would emit down through the transparent top plate and onto the fluid which may include a fluorophore that is excited by the light.

A third option for the light source is to integrate one or more emitters (for example, a thin film LEDs or thin film lasers) onto the inner surface of the top microfluidic plate in the hole in the center of the photodetector. This emitter would emit down into the fluid which may include a fluorophore that is excited by the light.

Fluorescence generated in the fluid 106 or other light, or another light producing sensing mechanism in the liquid other than fluorescence may be sensed by the photodetector(s) 102. The photodetector(s) 102 may be disposed on a wall 120 of a top plate 122 of the microfluidic device 104. Alternatively, the photodetector may be placed on the top wall of a transparent top plate. It is noted that the top plate 122 may be configured to provide a ground electrode for a digital or analog (continuous flow) microfluidic platform. The wall 120 is an interior wall of the microfluidic device 104 that partially forms an interior space 124 where the fluid 106 and photodetector 102 are positioned. The interior space 124 may be, for example, a microfluidic channel for receiving a continuous flow of fluid, or a space for holding a droplet of fluid. The photodetector 102 may generate an electrical signal representative of the light it receives. The photodetector 102 may be operatively connected to the electronic interface, and thereby output the generated electrical signal to an electronic interface or computing device.

The electronic interface 108 may include one or more input/output (I/O) modules 126 configured to operatively connect to the light source 112 and the photodetector 102. The I/O module(s) 126 may be connected to the light source 112 and the photodetector 102 via a wired connection.

The electronic interface 108 may include or provide output to a user interface 128 configured to present information and to receive user input. For example, the user interface 128 may include a display for displaying analysis data based on the electrical signals received from the photodetector 102. Further, the user interface 128 may include a keyboard, mouse, or the like for input of instructions from the user for implementing a test of fluid 106.

In this example, the light source 112 may be one or more light emitting diodes (LEDs) or lasers or any other suitable light or lamp source for generating light for direction towards fluid 106 via the optical fiber 114. Although, it should be understood that any other suitable light source and mechanisms for directing light to fluid 106 may be utilized. In other examples, light may be provided by a pigtailed laser with a waveguide, an on-chip bonded/fabricated light source with miniaturized optical lenses/mirrors for directing light into the aperture, and the like. Further, for example, light may be provided optically with a waveguide either on top or on the bottom of the top plate.

FIG. 2 illustrates a cross-sectional side view of an example microfluidic device 104 including an annular photodetector 102 integrated therein for acquisition of data of a fluid under test in accordance with embodiments of the present disclosure. Referring to FIG. 2, the microfluidic device 104 includes a top plate, generally designated 200, and a bottom plate, generally designated 202, that may be attached together to form the microfluidic device 104. The top plate 200 and the bottom plate 202 may be suitably bonded together. In examples, the top plate 200 and the bottom plate 202 may be attached using secure seal gaskets. The two plates can also be held together with clamps along with spacers to maintain appropriate fixed spacing between the top and bottom. In another example, the system may adhesively bonded together, bonded with heat or metal, or any other suitable technique for bonding components together. In the case of bonding components, liquid loading ports may be provided as drilled holes, integrated capillaries may be used to fill reservoirs, or any other suitable techniques may be used. Further, the top plate 200 and the bottom plate 202 may define an interior space 204 therebetween. Fluid under test may be positioned within the interior space 204. It is noted that the microfluidic device 104, particularly its layers, are not drawn to scale in the figure.

The top plate 200 includes a substrate 206. In this example, the substrate 206 is made of borosilicate glass. Any suitable material can be used for the top plate, including glasses, plastics, semiconductors, or conductors. In some implementations, the top plate can be transparent to the optical signals. For these cases, example materials include, but are not limited to glasses, Kapton, acrylic, plastics, or materials with an energy gap larger than the photon energy of the transmitted light can be used. A photodetector 208 may be disposed on an underside of the substrate 206 such that it is positioned within the interior space 204. It is noted that in this example the underside of the substrate 206 directly contacts the photodetector 208; however, alternatively one or more layers may be disposed between the substrate 206 and the photodetector 208, and the substrate 206 may suitably be replaced with any other suitable material or layer.

The photodetector 208 appears in FIG. 2 as having two parts (labeled 208A and 208B for clarity) due to the photodetector 208 being shown in cross-section. However, the different layers of part 208A are portions of the same layer portions in part 208B. Corresponding portions of layers of parts 208A and 208B are in the same horizontal plane. Together the layers form an annular shape with an aperture 210 being defined in the center or approximately the center. It is noted that the aperature may be any suitable size or shape. In this example, the aperature 210 is round in shape, but may alternatively be square or rectangular. Note that multiple photodetectors, including multiple annular photodetectors, may also be used.

The photodetector 208 may include layers 212, 214, 216, 218, and 220. Layer 214 and layer 216 are a p-Si epilayer and an n-Si epilayer, respectively, for forming a p-n junction for converting received light to current. Layer 212 is a contact to the p-Si epilayer 214. Layer 218 is a contact to the n-Si epilayer 216. Layer 220 is a layer of nitride. These layers form a thin film Si photodetector in the current example.

Optical fiber 114 is shown with its end positioned at a top surface of substrate 206. Alternatively, the end of the optical fiber 114 may be positioned such that it extends into the aperture 222. For example, broken lines 114A indicate a positioning of an end of the optical fiber such that it extends into the aperture 222.

FIG. 3 illustrates a view of a photodetector, such as photodetector 208 shown in FIG. 2, from the indicated perspective in accordance with embodiments of the present disclosure. The view shown in FIG. 3 is from the perspective indicated by the double-arrow broken line designated by reference letters A in FIG. 2. Referring to FIG. 3, the double-arrow broken line designated by reference letters B in indicate the cross-section view shown in FIG. 2. Reference 302 indicates an aperture of the photodetector. Reference 300 indicates an aperture of the substrate. Note that the aperture of the system may not be defined by the aperture of the photodetector(s), but may be defined by another material such as metal. Reference 304 indicates a metallized ring on top of the photodetector for improving performance. Reference 306 indicates an electrical contact to the n-side. Reference 308 indicates a silicon p-n junction photodetector with silicon nitride on it. Reference 310 indicates an end of the metal on the substrate that starts from the substrate metal aperture. It is noted that the view of the photodetector is not drawn to scale.

Referring to FIG. 2, the bottom plate 202 may be any suitable substrate. In an example, the bottom plate 202 is made of silicon with deposited layers of appropriate material for optical and fluidic function. Examples include, but are not limited to, silicon nitride (SiNi), silicon dioxide, anti-reflection coatings, transparent contacts (e.g. Indium Tin Oxide), optical filter materials, amorphous fluoropolymers (e.g., the CYTOP® fluropolymer), hydrophobic coatings, and the like. The bottom plate 202 can be made of any suitable material such as, but not limited to, silicon, glass, or acrylic.

With continuing reference to FIG. 2, a portion of the optical fiber 114 may be positioned above or in an aperture, generally designated 222, of the substrate 206. The aperture 222 of the substrate 206 may align with the aperture 210 of the photodetector 208 such that light emitted by an end 224 of the optical fiber 114 can reach a fluid in the internal space 204. The general direction of the emitted light is indicated by arrow 226. In other examples, the light may be introduced in the internal space 204 by free space, waveguide illumination (including planar waveguides), or by any other suitable technique and mechanism. In an alternative example, the aperture may not be used, but rather one or more portions of the top or bottom plates or photodetector(s) may be transparent or arranged such that light may enter therethrough.

In operation, the introduced light may excite fluorophore in fluid (e.g., a droplet) positioned in the internal space 204, and may be absorbed by the bottom plate 202. The fluorescence generated in the fluid may be sensed by the photodetector 208. The optical configuration of the top plate 200, the bottom plate 202, and the photodetector 208 can advantageously achieve a high signal-to-noise ratio (SNR).

It is noted that the microfluidic device 104 of FIG. 2 may include one or more additional layers that are not shown. For example, an interlayer dielectric and silicon nitride may be disposed in the photodetector aperture. These layers may be included or not based on a position of the light source, the techniques of manufacture, and the like.

The material and design (e.g., layers, shape, etc.) of a photodetector in accordance with embodiments of the present disclosure can depend on the responsivity in the spectral region of interest, low dark current, photodetector geometry, and co-optimization with the fluidic system. In an example system, the fluorophore 6-Hex was selected for the fluid, dictating a light wavelength of 532 nm and a fluorescence output at an emission wavelength of 556 nm. Such an emission wavelength can advantageously, for example, enable the use of low-cost silicon for detection.

It is noted that a p-n junction photodetector as disclosed herein may include a p-layer, an n-layer, and contacts to both the p-layer and the n-layer. Although, there may be other layers involved in the packaging or surface passivation or additional functionality that can be deposited or grown on top of the photodetector. In examples provided herein, a silicon nitride layer is provided for surface passivation and anti-relection coating. In another example, another layer or combination of layers such as silicon nitride, ITO, and a hydrophobic coating may be provided. Any of the coatings or stack of coatings may be sufficiently thin to not prohibit fluid flow or optical detection.

FIG. 4 is a photomicrograph of an annular, thin film silicon photodetector bonded to a borosilicate substrate in accordance with embodiments of the present disclosure. In this example, the inner radius of the photodetector is 125 µm and outer radius is 675 µm. The aperture radius is 105 µm. Metallization at the back may range between 105 micron and 125 micron, and metallization on top may range between 125 micron and 250 microns. Detection can thus happen between 250 micron and 675 microns. The area between the aperture and the inner radius of the photodetector may be metallized to improve the SNR of the system by minimizing back illumination current.

In experiments, a stock solution was prepared by dissolving a fluorophore (here, 6-Hex, acid) in a mixture of an organic solvent (here, DMSO) and deionized water (DI water). The stock solution was further diluted to create lower concentrations of the fluorophore solutions for testing. These were tested in the system disclosed herein with a bottom plate made out of silicon substrate with an anti-reflection coating and a hydrophobic coating, and the top plate having a microfabricated structure. The microfabricated photodetector output was measured with an electronic interface in sampling mode and is shown as a function of dilution of the fluorophore solution in FIG. 5, which is a graph showing mean measured photocurrent as a function of the change in fluorophore solution dilution. The y-axis shows the measured photocurrent as a function of dilution of the fluorophore solution (in arbitrary units). The solution is more concentrated further away from origin on the x-axis.

In accordance with embodiment, a microfluidic system as disclosed herein may detect fluorophore. The system may include a thin film Si photodetector bonded to a pyrex-type substrate. The host substrate for the thin film photodetector may be a 500 µm thick pyrex. Using this transparent substrate can enable effective coupling of the pump light to the fluorophores in the droplets to be tested, through the aperture at the center of the photodetector. To bond the thin film photodetector to the pyrex substrate, the photodetector may be separated from its original substrate and subsequently bonded heterogeneously to a metal contact on the host pyrex substrate.

The starting material for fabrication of the photodetector may be a silicon-on-insulator (SOI) wafer with a 10 µm single crystal upper Si device layer on a 1 µm buried oxide layer on a 400 µm bulk silicon handle wafer. The upper Si device layer may be lightly p-type doped ($3 \times 10^{14}$ cm$^{-3}$) with boron. To create a p-n junction, spin-on-glass phosphorus dopant ($5 \times 10^{20}$ cm$^{-3}$) may be used with a diffusion anneal in a furnace at 1000° C. to create a p-n junction with a target junction depth for high responsivity at 556 nm. Alternative to a p-n junction, the device may have a p-i-n junction, an avalanche photodiode, a phototransistor, a photoconductor, a diode, transistor, or semiconductor device that converts the received light to current.

Subsequently, the photodetector area may be defined with a mesa etch in a Deep Reactive Ion Etcher (DRIE) using SF$_6$ and O$_2$. The mesa etch may be carried out with the buried oxide layer as the etch stop. A contact to the n-side may subsequently be patterned. A Ti/Au contact may be deposited using electron beam evaporation and liftoff. The sample may subsequently be inverted and bonded to a temporary carrier wafer using a suitable adhesive, such as WAFER-BOND® adhesive available from Brewer Science, Inc. The adhesive may be spun on the sample, as well as the temporary carrier wafer and subsequently both of those may be placed in contact in a bonding jig. The bonding jig may be placed in a vacuum oven and the bonding may be carried out at 180° C. The bulk silicon wafer handle portion of the SOI wafer may subsequently be etched away using multiple silicon etch cycles in the DRIE. Subsequently, the buried oxide layer may be etched using a buffered oxide etch solution. Subsequently, the contact to the p-side of the photodetector may be patterned. Also, an Al/Ti/Ni/Au ohmic contact may be evaporated and defined using liftoff. Separately, a Ti/Au contact may be patterned onto the host pyrex substrate, onto which the thin film Si photodetector may be permanently bonded.

Subsequently, the thin film Si photodetector embedded in adhesive is bonded to the metal on the pyrex host substrate, with the photodetector p-side contact bonding to the metal contact on the pyrex. The bonding may occur at a temperature of 250° C. for 2 hours in a vacuum oven. After the bonding, the temporary carrier with the adhesive may be removed from the bonded sample.

To complete the integration, a PI2611 polyimide interlayer dielectric may be spun onto the surface of the bonded photodetector and may be cured at 250° C. for four hours. Next, an Al mask may be patterned and deposited and subsequently the exposed polyimide is etched in a reactive ion etcher with using a combination of $CHF_3$ and $O_2$ at 500 mT pressure. A metal lead that connects the Ti/Au contact on the pyrex host substrate to the n-side of the photodetector may subsequently be patterned and deposited. Subsequently, silicon nitride may be deposited onto the sample, except on the contact pads, using a Plasma Enhanced Chemical Vapor Deposition (PECVD) system. This layer acts as an anti-reflection coating, as well as a Si surface passivation layer to minimize the dark current. Thin wires may subsequently be soldered to the contact pads on the pyrex. Note that the thin film Si photodetector is only about 10 μm thick, and thus would not be expected to interfere with the flow of fluid through a microfluidic channel.

In experiments, a top and bottom plate structure as shown in FIG. 1 was used to test a thin film Si fluorescence photodector. The experimental system used a 532 nm laser pump source which is free space coupled to a 50 μm diameter optical fiber for optical delivery to the internal space of the microfluidic system where the photodetector is positioned. The optical fiber is aligned to the aperture at the back of the photodetector, and may be bonded to the pyrex using UV-cured epoxy. This assembly of the optical fiber bonded to the pyrex plate with the thin film photodetector bonded to it are referred to herein as the "top plate" of the system, as it mimics the top plate of a microfluidics system.

The droplet to be tested is located between the top plate and a bottom plate, as shown in FIG. 1 (not to scale). The bottom plate of the system for this demonstration is a 600 μm thick silicon wafer with 65 nm of PECVD deposited silicon nitride (as an anti-reflection coating) deposited on it, followed by a thin hydrophobic spun-on layer of Cytop. In the experiment, the gap between the top plate and bottom plate was 160 μm, defined by a gasket that was laser cut from an adhesive sheet. The adhesive was used only on the bottom plate, to adhere the gasket to the bottom plate.

The gasket can ensure that the height between the top plate and the bottom plate remains constant at a suitable distance. In this example, the gasket maintains a height of about 160 microns. Even though it is a two-sided adhesive sheet, it can be adhered to the bottom plate and the top adhesive part is not remove. The gasket 614 may be circular in shape and have an interior diameter of about 160 μm. Alternatively, the gasket can be any shape depending on the spatial requirements and electrode configuration or any other experimental constraints.

In general, a microfluidic device in accordance with embodiments of the present disclosure may be made by any suitable microfabrication technique. In an example, manufacture may begin with cleaning a silicon-on-insulator (SOI) wafer, which includes a wafer handle followed by a buried oxide layer followed by a thin device layer. This may be followed by using a dopant to diffuse to form a pn junction in the device layer. After forming the pn junction, photolithography and metallization may be used to pattern the contact to the one side of the pn junction device. Subsequently, the device layer may be etched to define the active area of the photodetector. After defining the active area, the sample may be inverted and bonded to a temporary carrier wafer with temporary adhesive. This can be followed with etching off the wafer handle and the buried oxide layer. After etching, photolithography and metallization may be used to pattern contact to the other side of the pn junction device. A similar contact with a lead to probe may be patterned on the final substrate for the photodetector and the device gets bonded to the final substrate. After then removing the temporary carrier from the device bonded to the final substrate, an interlayer dielectric may be applied. After using the appropriate patterning to etch the interlayer dielectric, a lead to the top of the device is patterned using photolithography and metallization. Subsequently, an anti-reflection coating of appropriate thickness can be deposited or sputtered for surface passivation as well as low reflection.

In accordance with embodiments, FIG. 6 illustrates a cross-sectional view of a bottom plate 600 for use with a microfluidic system as disclosed herein. For example, the bottom plate 600 may be used in place of the bottom plate 202 shown in FIG. 2. Referring to FIG. 6, the bottom plate 600 comprises a layer of silicon 602, a layer of $SiO_2$, a layer of $Si_3N_4$ 604, a layer of indium tin oxide (ITO) 608, and a layer of parylene. In this example, the $SiO_2$ layer 604 is about 861 nm thick but may be of any other suitable thickness. The $Si_3N_4$ layer 606 is about 200 nm thick but may be of any other suitable thickness. The ITO layer 608 is about 170 nm thick but may be of any other suitable thickness. The parylene layer 610 is about 1400 nm thick but may be of any other suitable thickness. A layer of Cytop 612 may be disposed on top of the parylene layer 610. A gasket 614 may be adhered on top of the Cytop layer 612.

It is noted that the bottom plate can be made with any suitable layers that may be needed in that specific microfluidic structure. If it is flow microfluidics, glass/PDMS/SU-8 may be used. For digital microfluidics, metal, dielectric and hydrophobic coating, and/or the like may be used. For other microfluidic operation principles, suitable layers should be used accordingly.

A gasket can also be made with materials such as SU-8, PDMS, etc. Instead of using these materials, we could also use spacers along with different ways of bonding, if need be. A gasket 614 may be disposed on top for maintaining a fixed spacing between the top plate and the bottom plate The gasket 614 may be circular in shape and have an interior diameter of about 160 μm.

In accordance with embodiments, a bottom plate may include a metal, a dielectric, and a hydrophobic coating on any suitable substrate. It is noted that these layers and any other suitable layers of suitable materials may be utilized as will be understood by those of skill in the art.

FIGS. 7A-7K are cross-sectional side views showing various stages in an example microfabrication process for producing a microfluidic device in accordance with embodiments of the present disclosure. It should be understood that this process is an example of process for producing the microfluidic device and should not be considered limiting, because other suitable techniques may be used for producing the microfluidic devices disclosed herein. For example, the various techniques used to arrive at the stages shown in FIGS. 7A-7K may be substituted with any other suitable fabrication technique.

Referring to FIG. 7A, a silicon on insulator (SOI) 700 wafer is provided. Subsequently, diffusion annealing is provided at about 1000° C. at FIG. 7B. At FIG. 7C, Ti/Au 702 is deposited, and a mesa structure 704 is defined.

At FIG. 7D, the result of FIG. 7C is inverted and bonded to a temporary carrier 706. Subsequently at FIG. 7E, the process includes etching the thick silicon wafer handle. At FIG. 7F, the process includes etching the buried oxide layer 708. At FIG. 7G, the process includes patterning and depositing Al/Ti/Ni/Au contacts 710 on the opposing side of the device.

At FIG. 7H, the device 712 shown in FIG. 7G is inverted and heterogeneously bonded to a pyrex wafer 714 that already has patterned metal 716. Subsequently, at FIGS. 7I-7K, the temporary carrier wafer is removed, and the polyimide interlayer dielectric 718 is patterned. FIG. 8A is an image of a top view of the device after the step of FIG. 7K. FIG. 8B is an image of a top view of the device as of a final step of an example fabrication. FIG. 9 is a top view of a schematic of the device after patterning and evaporating Ti/Au lead to the contact on the device, and depositing SiN anti-reflection coating. FIG. 9 shows a schematic of the top view of the device. The rectangular contact pads are connections to the p- and n-side of the silicon respectively. The nitride layer is deposited on the left side of the shown schematic, so that the area containing the contact pads (on the right side of the device) does not have any silicon nitride.

In accordance with embodiments, light may be delivered to fluid within an internal space of a microfluidic device in any suitable manner. For example, in the instance of a substrate being transparent or translucent, an LED or laser may emit light directed to an exterior wall (e.g., top plate) of a microfluidic device and the light may thereby pass through the transparent wall and to the interior space holding the fluid. In another example, an emitter may deliver light through an optical fiber or waveguide to the exterior wall. In the instance of a substrate being not transparent, light may be delivered through an optical fiber, which may be inserted into or located near an aperture that leads to the interior space for delivering the light to the interior space. Alternatively, a waveguide may be engaged with the aperture for delivering the light to the interior space.

FIG. 10 illustrates a cross-sectional side view of an example top plate 1000, photodetector 1002, and light source 1004 configuration for a microfluidic device in accordance with embodiments of the present disclosure. Referring to FIG. 10, the top plate 1000 is a substrate that is transparent. The light source 1004 is a fiber optic having one end connected to an LED or laser for directing light into the fiber optic such that the light (generally designated 1008) emits from an end 1006 of the fiber optic. Since the top plate 1000 is a transparent, the light 1008 can pass through the top plate and enter the interior space 1010 of the microfluidic device for illuminating a fluid. As shown, photodetector 1002 is positioned in the interior space 1010. In another example, the substrate may be semi-transparent such that at least some of the light 1008 emitted from the fiber optic passes through the substrate to the interior space 1010. In yet another example, a portion of the substrate may be transparent or translucent where the light 1008 is received such that some or all of the light 1008 passes through the substrate.

In accordance with embodiments, an LED may be disposed on an outside surface of a microfluidic device. The microfluidic device may have a transparent or translucent portion at or near the LED that extends to its interior space such that light emitted by the LED can pass through the transparent or translucent portion to reach the interior space. FIG. 11 illustrates a cross-sectional side view of portion of a microfluidic device in which an LED 1100 is disposed on its outside surface in accordance with embodiments of the present disclosure. Referring to FIG. 11, top plate 1000 is a substrate that is transparent or translucent. Since the top plate 1000 is transparent, the light 1008 from the LED 1100 can pass through the top plate and enter the interior space 1010 of the microfluidic device for illuminating a fluid. As shown, photodetector 1002 is positioned in the interior space 1010.

In accordance with embodiments, a thin film emitter (LED, laser, waveguide) may be disposed in the interior space of a microfluidic device for illuminating a fluid in the interior space. FIG. 12 illustrates a cross-sectional side view of a portion of a microfluidic device in which an LED 1100 is disposed in its interior space 1010 in accordance with embodiments of the present disclosure. Referring to FIG. 12, top plate 1000 is a substrate with the LED 1100 disposed on an interior side thereof. As shown, photodetector 1002 is positioned in the interior space 1010. Light 1200 emitted by the LED 1100 may directly illuminate fluid within the interior space 1010.

In accordance with embodiments, waveguide may be integrated into a microfluidic device for illuminating a fluid in the interior space. FIG. 13 illustrates a cross-sectional side view of a portion of a microfluidic device in which a waveguide 1300 is integrated into a top plate 1000 of a microfluidic device in accordance with embodiments of the present disclosure. Referring to FIG. 13, the waveguide 1300 is within the top plate 1000. Further, the waveguide 1300 is positioned such that light 1200 emitted from the waveguide 1300 is directed towards the interior space 1010.

FIG. 14 is a cross-sectional side view of portion of a microfluidic device in which a waveguide 1400 is disposed on its outside surface in accordance with embodiments of the present disclosure. This configuration of placement of the waveguide 1400 shown in FIG. 14 may be alternative to use of the LED 1100 shown in FIG. 11. Referring to FIG. 14, the end of the waveguide 1400 may be placed such that light from the end of the waveguide emits into the substrate and interior space of the microfluidic device as shown.

FIG. 15 is a graph showing characterization of a photodetector fabricated for experimentation. The graph shows an IV curve for the photodetector.

FIG. 16 is a graph showing another characterization of a photodetector fabricated for experimentation. The graph shows responsivity of the photodetector as a function of wavelength.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A microfluidic system comprising:
   a body including an interior wall that at least partially defines an interior space for receipt of fluid, wherein the body defines a first aperture that extends into the interior space through the body and the interior wall for providing a path for light to illuminate the fluid; and
   a photodetector disposed on the interior wall and positioned to receive light from the illuminated fluid in the interior space for generating an electrical signal representative of the received light, wherein the photodetector defines a second aperture for forming the path for light with the first aperture, wherein the first aperture and the second aperture are substantially aligned.

2. The microfluidic system of claim 1, wherein the body comprises a substrate comprising a side upon which the photodetector is disposed.

3. The microfluidic system of claim 2, wherein the substrate is made of a transparent material.

4. The microfluidic system of claim 1, wherein the body comprises a top plate and a bottom plate, wherein the top plate and the bottom plate are attached together one of permanently or non-permanently, and wherein the bottom plate and the top plate define the interior space therebetween.

5. The microfluidic system of claim 4, wherein the bottom plate comprises silicon including one of an anti-reflection coating and a fluoropolymer.

6. The microfluidic system of claim 4, wherein the bottom plate comprises a first layer comprising silicon, a second layer comprising $SiO_2$, a third layer comprising $Si_3N_4$, a fourth layer comprising indium tin oxide (ITO), a fifth layer comprising parylene, and a sixth layer comprising a hydrophobic coating.

7. The microfluidic system of claim 6, wherein the bottom plate further includes a gasket.

8. The microfluidic system of claim 1, wherein the interior space comprises a microfluidic channel for receiving a continuous flow of fluid, or a surface for receipt of a droplet of fluid.

9. The microfluidic system of claim 1,
   further comprising a light source configured to direct light into the first aperture and the second aperture, and to the interior space for illuminating fluid in the interior space.

10. The microfluidic system of claim 1, wherein the photodetector comprises one of a p-n junction, a p-i-n junction, an avalanche photodiode, a phototransistor, a photoconductor, a diode, transistor, a thin film photodetector, or semiconductor device that converts the received light to current.

11. The microfluidic system of claim 1, wherein the photodetector is substantially annular in shape, and wherein the second aperture extends through approximately a center of the photodetector.

12. The microfluidic system of claim 1, wherein the light received by the photodetector is fluorescence from the fluid.

13. The microfluidic system of claim 1, wherein the photodetector comprises a plurality of layers including a p-Si epilayer and an n-Si epilayer.

14. The microfluidic system of claim 13, wherein the p-Si epilayer and the n-Si epilayer contact each other, and
   wherein the plurality of layers further comprises contact layers, wherein the p-Si epilayer and the n-Si epilayer are positioned between the contact layers.

15. The microfluidic system of claim 1,
   further comprising an optical source configured to be coupled to fluid in the interior space through the first aperture and the second aperture via an optical fiber.

16. The microfluidic system of claim 1, wherein the photodetector is positioned in the interior space such that the photodetector contacts the fluid when the fluid is in the interior space.

17. The microfluidic system of claim 16,
   further comprising a light source configured to direct light to the interior space for illuminating fluid in the interior space.

18. The microfluidic system of claim 1, wherein the body includes a portion that is transparent or translucent for allowing light to pass from outside the body to the interior space, and
   wherein the microfluidic system further comprises a light source configured to direct light from outside the body, through the portion of the body, and to the interior space for illuminating fluid in the interior space.

19. A method of producing a microfluidic system, the method comprising:
   fabricating a photodetector on a side of substrate, wherein the substrate defines a first aperture that extends through the substrate for providing a path for light; and
   using the substrate to form a body with an interior space for receipt of fluid and for receipt of the light through the first aperture, the photodetector being positioned within the interior space to receive light from fluid in the interior space for generating an electrical signal representative of the received light, wherein the photodetector defines a second aperture for forming the path for light with the first aperture, wherein the first aperture and the second aperture are substantially aligned.

20. The method of claim 19, wherein the body comprises a top plate and a bottom plate, and
   wherein the method further comprises attaching the top plate and the bottom plate together to define the interior space therebetween.

21. The method of claim 20, wherein the bottom plate comprises a first layer comprising a mechanical bottom plate support, and subsequent layers that provide or enhance optical and fluidic system functions.

22. The method of claim 20, wherein the bottom plate comprises a first layer comprising silicon, a second layer comprising $SiO_2$, a third layer comprising $Si_3N_4$, a fourth layer comprising indium tin oxide (ITO), and a fifth layer comprising parylene, and a sixth layer comprising of Cytop.

23. The method of claim 20, wherein the bottom plate includes microfluidic structures.

24. The method of claim 19, wherein the interior space comprises a microfluidic channel for receiving a continuous flow of fluid, or a surface for receipt of a droplet of fluid.

* * * * *